(12) United States Patent
Sato et al.

(10) Patent No.: US 12,363,821 B2
(45) Date of Patent: Jul. 15, 2025

(54) CIRCUIT MODULE

(71) Applicant: Murata Manufacturing Co., Ltd., Kyoto (JP)

(72) Inventors: Ryota Sato, Nagaokakyo (JP); Motohiko Kusunoki, Nagaokakyo (JP); Tadashi Nomura, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 243 days.

(21) Appl. No.: 18/328,323

(22) Filed: Jun. 2, 2023

(65) Prior Publication Data

US 2023/0319977 A1    Oct. 5, 2023

Related U.S. Application Data

(63) Continuation of application No. PCT/JP2021/042078, filed on Nov. 16, 2021.

(30) Foreign Application Priority Data

Dec. 8, 2020  (JP) ................. 2020-203374

(51) Int. Cl.
*H05K 1/14*  (2006.01)
*H05K 1/02*  (2006.01)
(Continued)

(52) U.S. Cl.
CPC .......... *H05K 1/0216* (2013.01); *H05K 1/147* (2013.01); *H05K 1/185* (2013.01); *H05K 9/0084* (2013.01); *H05K 2201/0707* (2013.01)

(58) Field of Classification Search
CPC ...... H05K 1/0216; H05K 1/147; H05K 1/185; H05K 9/0084; H05K 2201/0707
(Continued)

(56) References Cited

U.S. PATENT DOCUMENTS 8,434,220 B2 *  5/2013  Rao ................ H01L 24/97
                                              29/841
10,410,972 B2    9/2019  Haji-Rahim et al.
(Continued)

FOREIGN PATENT DOCUMENTS

JP    2002-223095 A    8/2002
JP    2007-294828 A    11/2007
(Continued)

OTHER PUBLICATIONS

International Search Report for PCT/JP2021/042078 dated Feb. 15, 2022.

*Primary Examiner* — Binh B Tran
(74) *Attorney, Agent, or Firm* — McDonald Hopkins LLC

(57) ABSTRACT

To provide circuit module capable of shielding electromagnetic wave passing not only on side of electronic component but also below electronic component. Circuit module according to present disclosure includes main board, one first electronic component mounted on main board, and submodule mounted on main board. Submodule includes sub board, and second electronic component. Sub board includes bottom plate mounted on main board, and side plate extending upward from bottom plate. Second electronic component is mounted upper surface of bottom plate. Shield pattern are formed on lower surface of bottom plate, and outer side surface of side plate.

20 Claims, 20 Drawing Sheets

(51) Int. Cl.
*H05K 1/18* (2006.01)
*H05K 9/00* (2006.01)

(58) Field of Classification Search
USPC .......................................................... 361/728
See application file for complete search history.

(56) References Cited

U.S. PATENT DOCUMENTS

2006/0250780 A1    11/2006  Goodwin
2009/0091904 A1     4/2009  Hatanaka et al.
2010/0027225 A1*    2/2010  Yuda .................... H05K 3/4697
                                                156/247

FOREIGN PATENT DOCUMENTS

| WO | 2006/121478 A1 | 11/2006 |
| WO | 2014/178153 A1 | 11/2014 |
| WO | 2020/049989 A1 | 3/2020 |

* cited by examiner

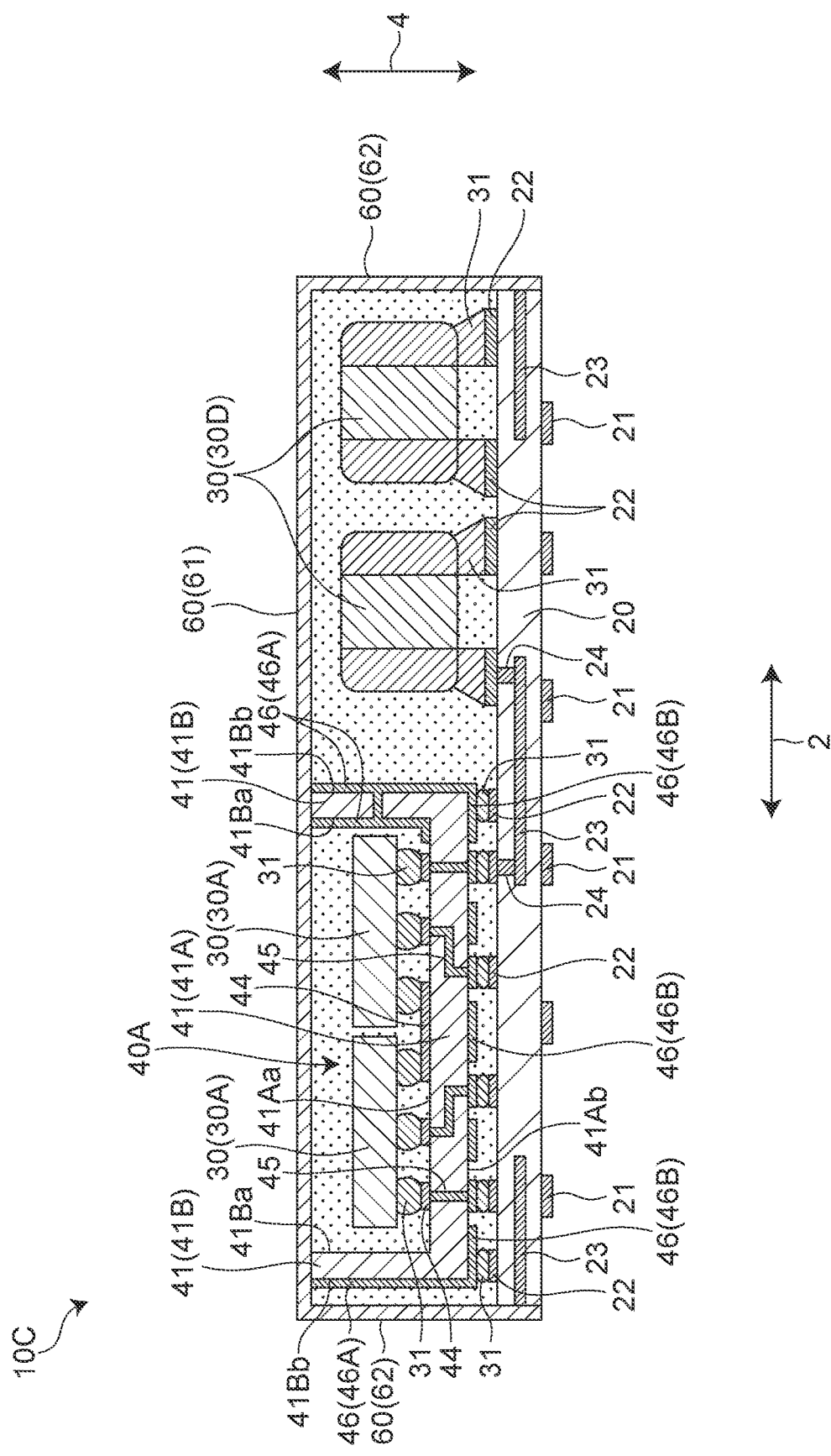

CIRCUIT MODULE

CROSS REFERENCE TO RELATED APPLICATION

This is a continuation of International Application No. PCT/JP2021/042078 filed on Nov. 16, 2021 which claims priority from Japanese Patent Application No. 2020-203374 filed on Dec. 8, 2020. The contents of these applications are incorporated herein by reference in their entireties.

BACKGROUND OF THE DISCLOSURE

Field of the Disclosure

The present disclosure relates to a circuit module including a submodule.

Description of the Related Art

Circuit modules including a submodule are known. The circuit module is obtained by mounting various electronic components on a board. The submodule is obtained by including a board different from the board of the circuit module and various electronic components mounted on the board, and packaging these. The submodule is mounted on the board of the circuit module as with other electronic components.

It is known to provide a shield member for shielding electromagnetic waves around an electronic component. The shield member reduces entry of electromagnetic waves from the outside into the electronic component. In addition, the shield member reduces leakage of the electromagnetic wave generated in the electronic component to the outside. For example, Patent Document 1 discloses a circuit module in which an electronic component is surrounded by a shield member including a plurality of wires.

PATENT DOCUMENTS

Patent Document 1: U.S. patent Ser. No. 10/410,972

BRIEF SUMMARY OF THE DISCLOSURE

In the circuit module disclosed in Patent Document 1, the electromagnetic wave passing through the sides of an electronic component is shielded by a shield member including a wire.

However, electromagnetic waves may pass not only on the side of the electronic component but also below the electronic component. For example, on a board having an electronic component mounted on the front surface, pattern wiring lines are formed not only on the front surface of the board but also on the back surface and an inner layer surface of the board. The electromagnetic wave generated in the interference component that generates the electromagnetic wave is radiated not only from the interfering-system component but also from the pattern wiring line routed from the interfering-system component. The electromagnetic wave radiated from the pattern wiring line may propagate in the board and pass below the electronic component.

In the circuit module disclosed in Patent Document 1, a shield member including a wire is erected upward from a front surface of a board. That is, the shield member is not provided inside or on the back surface of the board. Therefore, the shield member of the circuit module disclosed in Patent Document 1 cannot shield the electromagnetic wave propagating in the board and passing below the electronic component.

Therefore, an object of the present disclosure is to solve the above problems, and to provide a circuit module capable of shielding an electromagnetic wave passing not only on a side of an electronic component but also below the electronic component.

In order to achieve the object, the present disclosure is configured as follows. A circuit module according to one aspect of the present disclosure includes: a main board; at least one first electronic component mounted on the main board; and a submodule mounted on the main board. The submodule includes: a sub board mounted on the main board, at least one second electronic component mounted on the sub board, and a conductive shield member formed on the sub board. The sub board includes: a bottom plate mounted on the main board so as to face the main board, and a side plate extending from the bottom plate so as to be away from the main board. The second electronic component is mounted on at least one of a first surface on the opposite side from the main board in the bottom plate and a second surface continuous with the first surface among surfaces of the side plate. The shield member includes: a bottom shield member formed on the bottom plate, and a side shield member formed on the side plate.

According to the present disclosure, it is possible to shield the electromagnetic wave passing not only the side of the electronic component but also below the electronic component.

BRIEF DESCRIPTION OF THE SEVERAL VIEWS OF THE DRAWINGS

FIG. 17 is a cross-sectional view taken along line B-B in FIG. 16;

DETAILED DESCRIPTION OF THE DISCLOSURE

Figure 1:
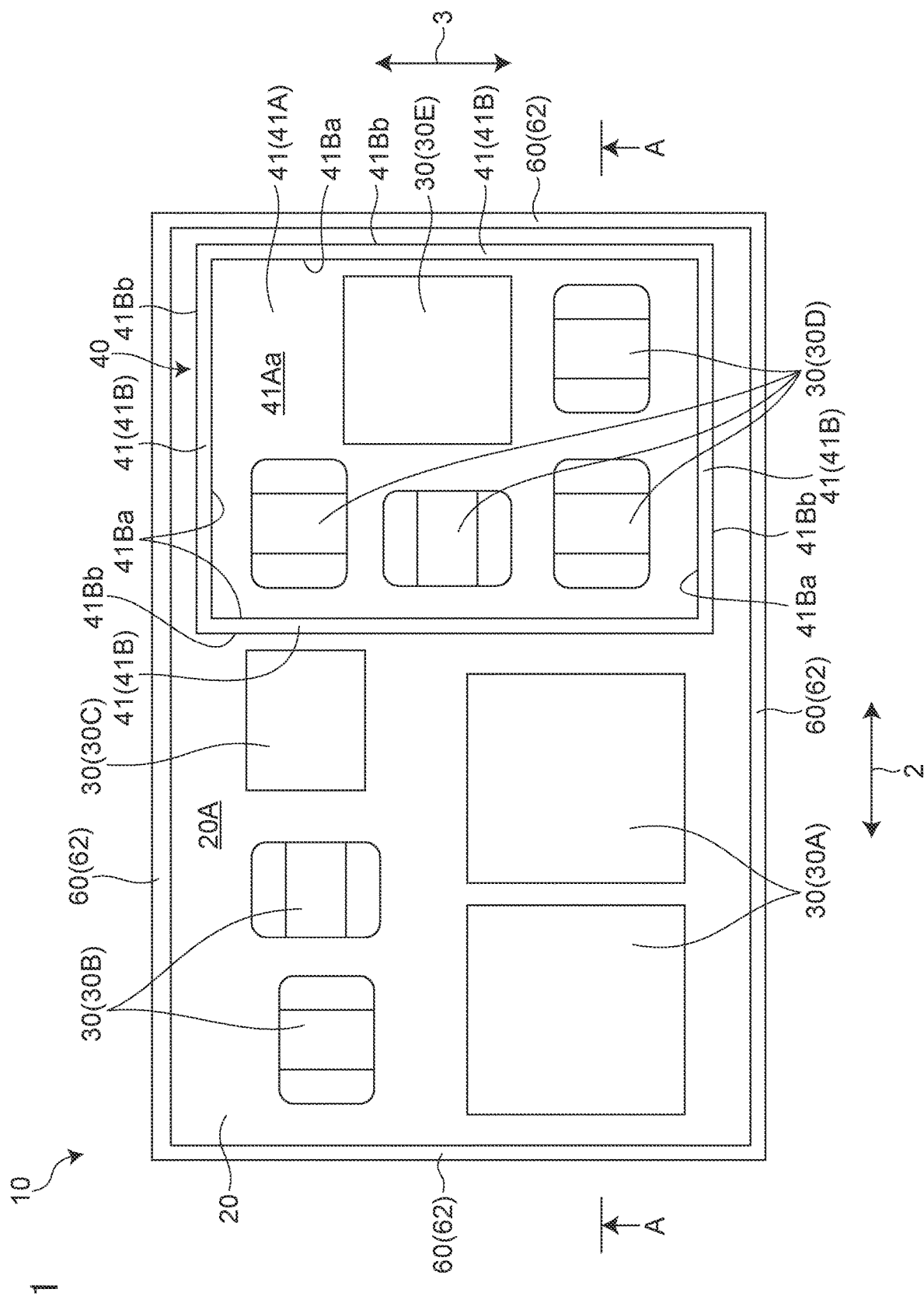
FIG. 1 is a plan view of a circuit module according to a first embodiment of the present disclosure.

A circuit module according to one aspect of the present disclosure includes: a main board; at least one first electronic component mounted on the main board; and a submodule mounted on the main board. The submodule includes: a sub board mounted on the main board, at least one second electronic component mounted on the sub board, and a conductive shield member formed on the sub board. The sub board includes: a bottom plate mounted on the main board so as to face the main board, and a side plate extending from the bottom plate so as to be away from the main board. The second electronic component is mounted on at least one of a first surface on the opposite side from the main board in the bottom plate and a second surface continuous with the first surface among surfaces of the side plate. The shield member includes: a bottom shield member formed on the bottom plate, and a side shield member formed on the side plate.

According to this configuration, the electromagnetic wave passing through the side of the second electronic component can be reduced by the side shield member formed on the side plate, and the electromagnetic wave passing below the second electronic component can be reduced by the bottom shield member formed on the bottom plate.

The bottom plate and the side plate may be formed by bending the sub board. According to this configuration, the number of plates constituting the submodule can be reduced.

The side plate may be positioned between the first electronic component and the second electronic component. According to this configuration, the influence of the electromagnetic wave between the first electronic component and the second electronic component can be reduced by the side shield member formed on the side plate.

The bottom shield member and the side shield member may be connected to each other. According to this configuration, the electromagnetic wave passing between the bottom plate and the side plate can be reduced.

The bottom shield member may be formed on a third surface on the main board side in the bottom plate. The third surface of the bottom plate is positioned between the second electronic component and the main board. Therefore, according to this configuration, the electromagnetic wave passing between the main board and the second electronic component can be reduced by the bottom shield member formed on the third surface of the bottom plate.

At least one of the bottom plate and the side plate may have an inner layer surface, and the shield member may be formed on the inner layer surface. According to this configuration, it is possible to increase the arrangeable region of the second electronic component on the first surface of the bottom plate and the second surface of the side plate, and the arrangeable region of the terminal electrode provided on the third surface of the bottom plate for mounting on the main substrate.

In a plan view, the second surface of the side plate may extend outward from the first surface along a side of the first surface of the bottom plate. According to this configuration, it is possible to increase the region where the electromagnetic wave can be shielded.

The first electronic component may include an interfered-system component to be affected by electromagnetic waves, and the second electronic component may include an interfering-system component that generates electromagnetic waves and does not need to include an interfered-system component to be affected by electromagnetic waves. According to this configuration, the shield member can reduce the influence of the electromagnetic wave generated in the second electronic component on the first electronic component positioned outside the submodule.

The first electronic component may include an interfering-system component that generates electromagnetic waves, and the second electronic component may include an interfered-system component that is affected by electromagnetic waves and does not need to include an interfering-system component that generates electromagnetic waves. According to this configuration, the shield member can reduce the influence of the electromagnetic wave generated in the first electronic component on the second electronic component provided in the submodule.

The interfered-system component may include an inductor, and the shield member may include a non-loop shaped non-loop portion on a plate that intersects with a winding axis of the inductor among the bottom plate and the side plate.

If the shield member formed on the bottom plate or the side plate intersecting the winding axis of the inductor has a loop shape, an eddy current is generated in the shield member having the loop shape. By the magnetic field generated by the eddy current affecting the inductor of the interfered-system component, characteristics of the inductor may be deteriorated. However, according to this configuration, the shield member has the non-loop shaped non-loop portion on the plate intersecting the winding axis of the inductor among the bottom plate and the side plate. Therefore, deterioration as described above of the characteristics of the inductor can be reduced.

The non-loop portion may be formed in a region facing the inductor on a plate that intersects a winding axis of the inductor among the bottom plate and the side plate.

According to this configuration, the non-loop portion is formed in a region facing the inductor in a plate that intersects the winding axis of the inductor among the bottom plate and the side plate. On the other hand, a shield member formed in a region that does not face the inductor in a plate intersecting the winding axis of the inductor among the bottom plate and the side plate, that is, a region less likely to affect the inductor by the magnetic field can be made to have a loop shape or a solid pattern. Accordingly, it is possible to enhance the shielding effect against the electromagnetic wave in the region not facing the inductor in the plate intersecting the winding axis of the inductor.

The non-loop portion may include a plurality of linear conductor portions formed side by side in a stripe shape. According to this configuration, a region for forming a pattern wiring line through which a signal passes or an electrode can be secured in a region between two adjacent linear conductor portions.

At least one of the bottom plate and the side plate may have a plurality of layer surfaces on each of which the non-loop portion is formed. A non-formed portion in which the shield member is not formed on one layer surface among the plurality of layer surfaces may overlap at least one formed portion in which the shield member is formed on at least one layer surface other than the one layer surface among the plurality of layer surfaces when viewed in a direction orthogonal to the one layer surface.

According to this configuration, the electromagnetic wave passing through the non-formed portion on the one layer surface can be shielded by the shield member formed in the formed portion on a layer surface other than the one layer surface.

When viewed in a direction orthogonal to the one layer surface, an outer edge portion of the formed portion on the layer surface other than the one layer surface may overlap the shield member positioned in a peripheral portion of the non-formed portion on the one layer surface.

According to this configuration, when viewed in the direction orthogonal to the one layer surface, the shield member on the one layer surface and the shield member on a layer surface other than the one layer surface partially overlap. Therefore, it is possible to prevent the electromagnetic wave from passing through the gap between the shield member on one layer surface and the shield member on a layer surface other than the one layer surface.

A circuit module according to an aspect of the present disclosure may be provided on the main board, and may include a sealing resin that covers the first electronic component and the submodule, and a conductive shield film that covers at least a part of the sealing resin. In this case, the non-loop portion may be away from the shield film.

According to this configuration, since the non-loop portion is away from the shield film, it is possible to prevent a loop shape from being formed by the non-loop portion and the shield film by connecting the non-loop portion to the shield film.

A circuit module according to an aspect of the present disclosure may be provided on the main board, and may include a sealing resin that covers the first electronic component and the submodule, and a conductive shield film that covers an upper part of the sealing resin. In this case, the upper end portion of the side plate may be in contact with the shield film, and the side shield member may be connected to the shield film.

According to this configuration, the shield member formed on the side plate is connected to the shield film covering the upper part of the sealing resin. Therefore, the electromagnetic wave passing between the upper end portion of the side plate and the shield film covering the upper part of the sealing resin can be reduced.

First Embodiment

Figure 2:
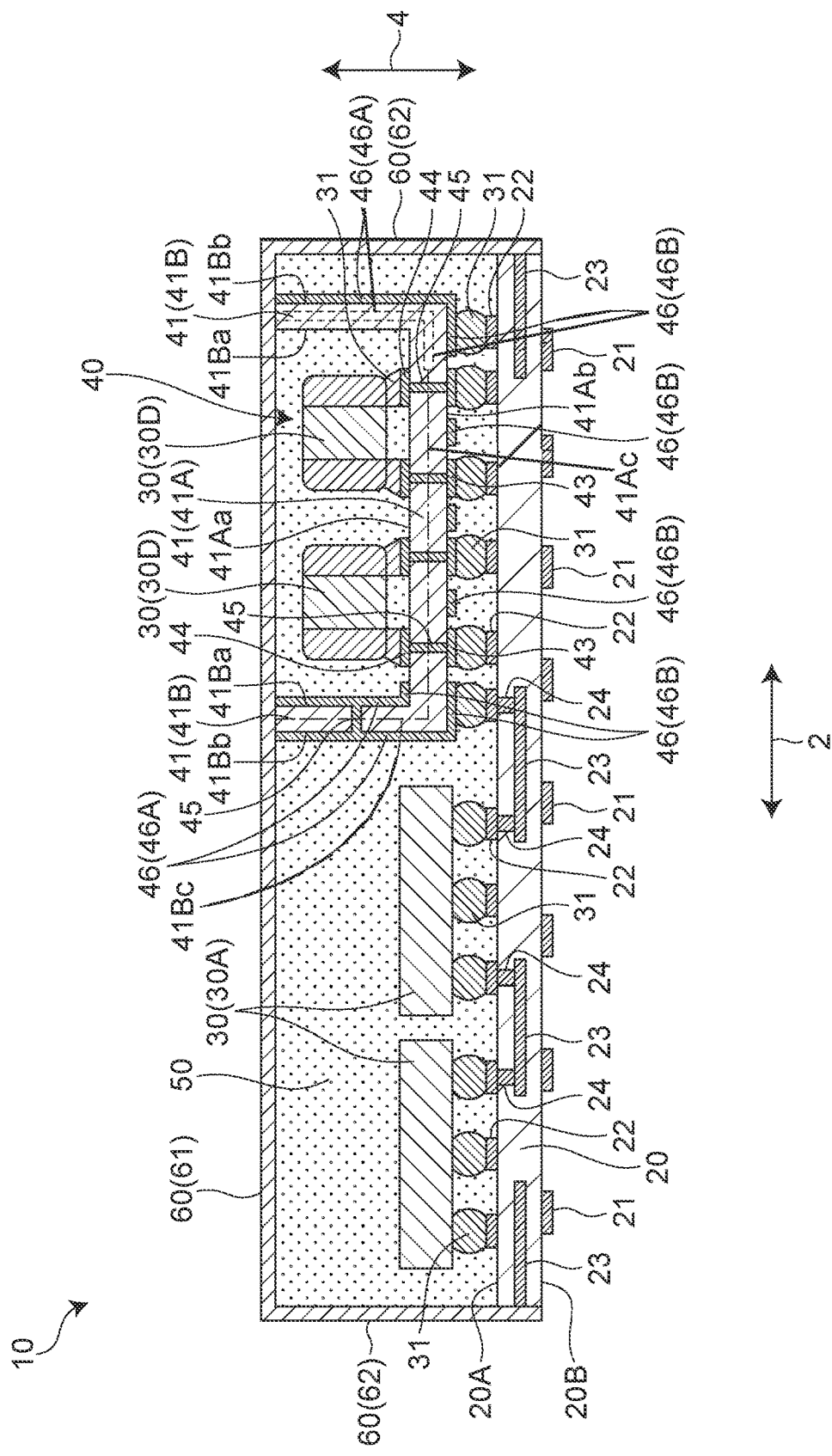
FIG. 2 is a cross-sectional view taken along line A-A in FIG. 1.

FIG. 1 is a plan view of a circuit module according to a first embodiment of the present disclosure. FIG. 2 is a cross-sectional view taken along line A-A in FIG. 1.

As shown in FIGS. 1 and 2, the circuit module 10 includes a main board 20, an electronic component 30, a submodule 40, a sealing resin 50, and a shield film 60. It should be noted that in FIG. 1 and FIG. 16 described below, illustration of the upper film 61 of the shield film 60 and the sealing resin 50 is omitted. In the first embodiment, the electronic components 30A, 30B, and 30C are mounted on the main board 20. The electronic components 30D and 30E are mounted on the submodule 40.

The circuit module 10 has a rectangular parallelepiped shape as a whole. In the following description, directions of respective sides of the circuit module 10 having a rectangular parallelepiped shape are defined as a longitudinal direction 2, a lateral direction 3, and a height direction 4. A side on which the upper film 61 (see FIG. 2) of the shield film 60 is positioned is defined as an upper side in height direction 4. It should be noted that the shape of the circuit module 1 is not limited to a rectangular parallelepiped shape.

The main board 20 is obtained by forming conductor electrodes and wiring lines on an insulator base material made of a resin such as glass epoxy, Teflon (registered trademark), or paper phenol, ceramic such as alumina, or the like.

In the first embodiment, as shown in FIG. 2, the main board 20 is a three-layer board in which a terminal electrode 21, an electrode 22, and a pattern wiring line 23 are formed on an upper surface 20A, a lower surface 20B, and an inner layer surface. The main board 20 has a structure in which two base materials are laminated. The front surface of the upper-side base material is the upper surface 20A of the main board 20. The front surface of the lower-side base material is the lower surface 20B of the main board 20. The space between the two base materials is the inner layer surface. In the first embodiment, the terminal electrode 21 is formed on the lower surface 20B, the electrode 22 is formed on the upper surface 20A, and the pattern wiring line 23 is formed on the inner layer surface.

It should be noted that the terminal electrode 21 may be formed on the upper surface 20A. The electrode 22 may be formed on the lower surface 20B or the inner layer surface. The pattern wiring line 23 may be formed on the upper surface 20A or the lower surface 20B. In addition, the number of layers of the main board 20 is not limited to three. For example, the main board 20 may be a single-layer board (single-sided board) or a multilayer board such as a four-layer board.

When the main board 20 is made of ceramic, the terminal electrode 21, the electrode 22, and the pattern wiring line 23 are obtained by co-firing a conductive paste printed on the main board 20 with the main board 20. In this case, the terminal electrode 21, the electrode 22, and the pattern wiring line 23 are made of, for example, copper. When the main board 20 is made of resin, the terminal electrode 21, the electrode 22, and the pattern wiring line 23 are formed on each surface (upper surface 20A, lower surface 20B, and inner layer surface) by a known means such as etching. In this case, the terminal electrode 21, the electrode 22, and the pattern wiring line 23 are made of, for example, metal foil.

When the circuit module 10 is mounted on a board or the like (not shown), the terminal electrode 21 is connected to an electrode formed on the board or the like.

The electronic components 30A, 30B, and 30C and the submodule 40 (specifically, the bottom plate 41A of the sub board 41 of the submodule 40) are electrically connected to the electrode 22. That is, the electronic components 30A, 30B, and 30C and the submodule 40 are mounted on the electrode 22.

In the first embodiment, the electronic components 30A, 30B, and 30C and the submodule 40 are connected to the electrode 22 through the conductive member 31. The conductive member 31 is, for example, solder, an adhesive containing copper, silver, or the like. It should be noted that as a method of connecting the electronic components 30A, 30B, and 30C and the submodule 40 to the electrode 22, another known connection method can be adopted.

A via conductor 24 is formed in the main board 20. In the first embodiment, a plurality of via conductors 24 are formed on the main board 20. The via conductor 24 is obtained by plating and forming a conductive metal made of copper or the like in a through-hole (via) vertically penetrating each base material in the case of a resin substrate, or by filling the through-hole with a conductive paste and co-firing with a ceramic in the case of a ceramic board.

In the first embodiment, the via conductor 24 penetrates the upper-side base material of the two base materials. Accordingly, the via conductor 24 electrically connects the electrode 22 formed on the upper surface 20A and the pattern wiring line 23 formed on the inner layer surface. It should be noted that by penetrating the lower-side base material, the via conductor 24 may electrically connect the pattern wiring line 23 and the terminal electrode 21 formed on the lower surface 20B.

As shown in FIG. 1, the electronic components 30A, 30B, and 30C and the submodule 40 are mounted on the upper surface 20A of the main board 20. In the first embodiment, the circuit module 10 includes two electronic components 30A, two electronic components 30B, and one electronic component 30C. The electronic components 30A, 30B, and 30C are examples of the first electronic component. The two electronic components 30A are interfering-system components that generate electromagnetic waves, and are, for example, power amplifiers. The electronic components 30B and 30C are components less likely to generate electromagnetic waves and less likely to be affected by electromagnetic waves, and are, for example, resistors and capacitors.

It should be noted that only the interfering-system components may be mounted on the upper surface 20A of the main board 20. That is, at least some of the electronic components 30 mounted on the upper surface 20A of the main board 20 only need to be interfering-system components. That is, in the first embodiment, the first electronic component includes an interfering-system component.

In addition, the number of each of the electronic components 30A, 30B, and 30C is not limited to the number shown in FIG. 1. In addition, the respective types of the electronic components 30A, 30B, and 30C are not limited to those listed above (resistor and the like), and various known electronic components can be mounted on the main board 20. In addition, in the first embodiment, all the electronic components 30A, 30B, and 30C are of a front surface mount type, but the present disclosure is not limited thereto. For example, at least one of the electronic components 30A, 30B, and 30C may be of an insertion type. In addition, as a method of mounting each of the electronic component 30A, 30B, and 30C on the electrode 22, various known mounting methods such as a flip chip can be adopted. The arrangement positions of the electronic components 30A, 30B, and 30C and the submodule 40 are not limited to the arrangement positions shown in FIGS. 1 and 2.

As shown in FIGS. 1 and 2, the submodule 40 is mounted on the upper surface 20A of the main board 20. As described above, the submodule 40 is electrically connected to the electrode 22.

It should be noted that in the first embodiment, one submodule 40 is mounted on the main board 20, but a plurality of submodules 40 may be mounted on the main board 20. That is, the circuit module 10 may include a plurality of submodules 40. The configuration of the submodule 40 will be described in detail below. It should be noted that the expression "sub" of the submodule 40 does not limit the function of the submodule 40 to the circuit module 10. For example, a main control IC of the circuit module 10 may be included in the submodule 40.

As shown in FIG. 2, the sealing resin 50 is provided on the upper surface 20A of the main board 20. The sealing resin 50 is made of a resin such as an epoxy resin.

The sealing resin 50 covers the electronic components 30A, 30B, and 30C and the submodule 40. In the first embodiment, the electronic components 30A, 30B, and 30C are completely buried in the sealing resin 50. That is, all of the electronic components 30A, 30B, and 30C are covered with the sealing resin 50. On the other hand, in the first embodiment, the submodule 40 has a portion excluding its upper surface buried in the sealing resin 50. That is, a part of the submodule 40 is covered with the sealing resin 50.

It should be noted that the sealing resin 50 may cover only a part of the electronic components 30A, 30B, and 30C. For example, a small-type electronic component may be completely buried in the sealing resin 50, but a large-type electronic component 30 may have a portion excluding its upper surface buried in the sealing resin 50. That is, the sealing resin 50 only needs to cover at least some of the electronic components 30A, 30B, and 30C. In addition, the sealing resin 50 may cover the entire submodule 40. For example, the submodule 40 may be completely buried in the sealing resin 50. That is, the sealing resin 50 only needs to cover at least a part of the submodule 40.

As shown in FIG. 2, the shield film 60 is provided so as to cover the main board 20 and the sealing resin 50 from above. As shown in FIG. 1, the shield film 60 surrounds the electronic components 30A, 30B, and 30C and the submodule 40 mounted on the main board 20 in a plan view (when viewed from above). The shield film 60 is made of a conductive member such as copper.

As shown in FIGS. 1 and 2, the shield film 60 includes an upper film 61 and a side film 62. The side film 62 extends downward from the peripheral edge portion of the upper film 61. That is, the shield film 60 has a box shape opened downward. The upper film 61 is in contact with the sealing resin 50 and the submodule 40 from above. That is, the upper film 61 covers the upper part of the sealing resin 50 and the upper part of the submodule 40. The side film 62 is in contact with the sealing resin 50 and the main board 20 from the side. That is, the side film 62 covers the side of the sealing resin 50 and the side of the main board 20. As described above, the shield film 60 covers the side of the main board 20 and the side and the upper part of the sealing resin 50.

It should be noted that the shield film 60 only needs to cover at least a part of the sealing resin 50. For example, the shield film 60 does not need to include the side film 62. In this case, the shield film 60 covers the upper part of the sealing resin 50 but does not cover the side of the sealing resin 50.

Hereinafter, the configuration of the submodule 40 will be described in detail.

As shown in FIG. 2, the submodule 40 is covered with the upper film 61 of the shield film 60 and the sealing resin 50.

As shown in FIGS. 1 and 2, the submodule 40 includes a sub board 41 and a plurality of electronic components 30D and 30E. The electronic components 30D and 30E are examples of the second electronic component.

As with the main board 20, the sub board 41 is made of resin, ceramic, or the like. The sub board 41 includes a bottom plate 41A and a side plate 41B.

As shown in FIG. 2, the bottom plate 41A faces the main board 20 in the height direction 4. The bottom plate 41A is positioned above the main board 20. In the first embodiment, the bottom plate 41A is smaller than the main board 20 in a plan view. It should be noted that in a plan view, the bottom plate 41A may have a size of the main board 20 or larger.

The side plate 41B extends upward from the outer edge portion of the bottom plate 41A. That is, the side plate 41B extends from the bottom plate 41A so as to be away from the main board 20. In the first embodiment, as shown in FIG. 1, the side plate 41B is provided on all sides of the bottom plate 41A in a plan view. That is, the sub board 41 has a box shape with the upper part opened.

It should be noted that the side plate 41B may extend upward from a portion other than the outer edge portion of the bottom plate 41A. In addition, the side plate 41B does not need to extend straight upward in the height direction 4 from the bottom plate 41A. That is, the side plate 41B does not need to be perpendicular to the bottom plate 41A. For example, the side plate 41B may extend in a direction inclined with respect to the bottom plate 41A in the height direction 4.

The upper end portion of the side plate 41B is in contact with the upper film 61 of the shield film 60 from below.

Figure 3:
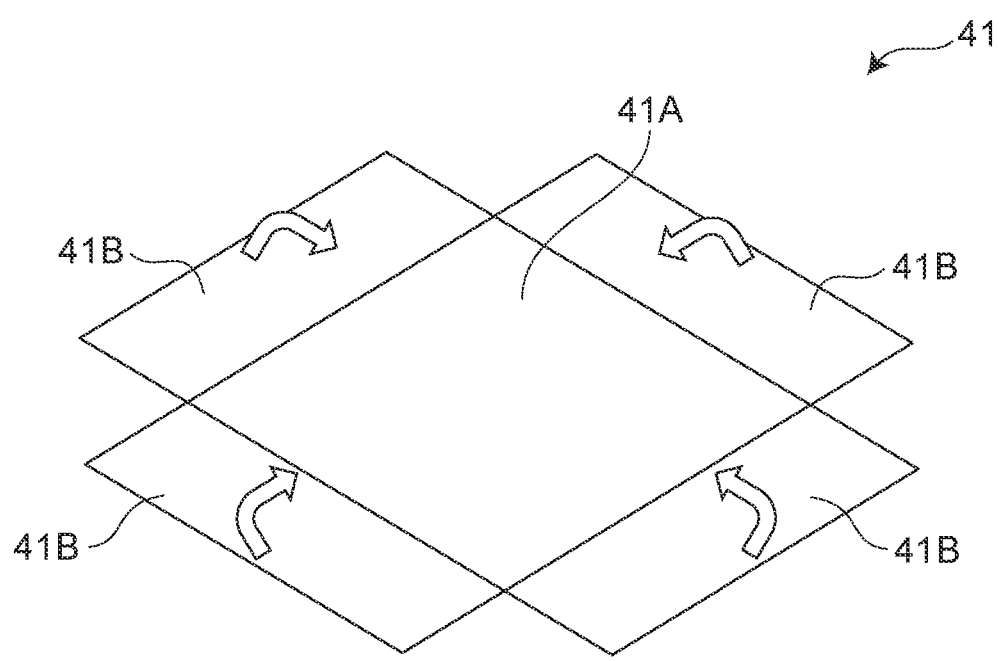
FIG. 3 is a perspective view showing an example of bending of a sub board of a submodule.

FIG. 3 is a perspective view showing an example of bending of the sub board of the submodule. In the first embodiment, as shown in FIG. 3, the bottom plate 41A and the side plate 41B are formed by bending one sub board 41.

In the first embodiment, the sub board 41 is a flexible board. However, the sub board 41 only needs to have flexibility, and is not limited to a flexible board. For example, the sub board 41 may be a rigid flexible board. In this case, for example, in the sub board 41, a boundary portion between the bottom plate 41A and the side plate 41B is a flexible portion having flexibility, and a portion other than the boundary portion is a rigid portion made of a hard material.

The bottom plate 41A and the side plate 41B may be formed by curving one sub board 41 rather than bending one sub board 41. That is, in the first embodiment, the bottom plate 41A and the side plate 41B are formed by bending one sub board 41.

In addition, the bottom plate 41A and the side plate 41B may be different boards. In this case, the bottom plate 41A and the side plate 41B may be formed into one sub board 41 by a known means such as fitting or bonding, or may be mounted on the main board 20 with each remaining as a separate board.

In the first embodiment, as shown in FIG. 2, the sub board 41 is a two-layer board (double-sided board). The bottom plate 41A has an upper surface 41Aa and a lower surface 41Ab, and the side plate 41B has an inner side surface 41Ba and an outer side surface 41Bb. The outer edge portion of the upper surface 41Aa in a plan view is continuous with the lower end portion of the inner side surface 41Ba. The outer edge portion of the lower surface 41Ab in a bottom view (when viewed from below) is continuous with the lower end portion of the outer side surface 41Bb. The upper surface 41Aa of the bottom plate 41A is an example of the first surface. The inner side surface 41Ba of the side plate 41B is an example of the second surface. A terminal electrode 43, an electrode 44, and a shield pattern 46 are formed on each surface (the upper surface 41Aa and the lower surface 41Ab of the bottom plate 41A, and the inner side surface 41Ba and the outer side surface 41Bb of the side plate 41B) of the sub board 41. The shield pattern 46 is an example of the shield member.

The terminal electrode 43 is formed on the lower surface 41Ab of the bottom plate 41A. The electrode 44 is formed on the upper surface 41Aa of the bottom plate 41A. The shield pattern 46 is formed on the upper surface 41Aa and the lower surface 41Ab of the bottom plate 41A, and the inner side surface 41Ba and the outer side surface 41Bb of the side plate 41B.

It should be noted that the terminal electrode 43 may be formed on a portion other than the lower surface 41Ab of the bottom plate 41A (for example, the outer side surface 41Bb of the side plate 41B). The electrode 44 may be formed on the lower surface 41Ab of the bottom plate 41A, the inner side surface 41Ba of the side plate 41B, or the outer side surface 41Bb of the side plate 41B. The shield pattern 46 may be formed only on some surfaces of the bottom plate 41A and the side plate 41B.

In addition, the sub board 41 may be a single-layer board (single-sided board), or may be a multilayer board having the number of layers other than two layers. As described above, when the bottom plate 41A and the side plate 41B are different boards, the number of layers of the bottom plate 41A and the number of layers of the side plate 41B may be the same or different.

The terminal electrode 43, the electrode 44, and the shield pattern 46 are configured similarly to the terminal electrode 21, the electrode 22, and the pattern wiring line 23. That is, the terminal electrode 43, the electrode 44, and the shield pattern 46 are obtained by co-firing a conductive paste printed on the sub board 41 with the sub board 41. In this case, the terminal electrode 43, the electrode 44, and the shield pattern 46 are made of, for example, copper. When the sub board 41 is made of resin, the terminal electrode 43, the electrode 44, and the shield pattern 46 are formed on each surface of the sub board 41 by a known means such as etching. In this case, the terminal electrode 43, the electrode 44, and the shield pattern 46 are made of, for example, a metal foil.

The lower surface 41Ab of the bottom plate 41A faces the upper surface 20A of the main board 20 in the height direction 4. The terminal electrode 43 formed on the lower surface 41Ab is connected to the electrode 22 formed on the upper surface 20A of the main board 20 through the conductive member 31. That is, the bottom plate 41A is mounted on the main board 20 so as to face the main board 20.

The electronic components 30D and 30E are electrically connected to the electrode 44. That is, the electronic components 30D and 30E are mounted on the electrode 44. In the first embodiment, the electronic components 30D and 30E are connected to the electrode 44 through the conductive member 31. As a method for connecting the electronic components 30D and 30E to the electrode 44, another known connection method can be adopted. As shown in FIG. 1, a side plate 41B is positioned between the electronic components 30D and 30E and the electronic components 30A, 30B, and 30C.

As shown in FIG. 2, the shield pattern 46 includes a side shield pattern 46A and a bottom shield pattern 46B. The side shield pattern 46A is formed on the side plate 41B. The bottom shield pattern 46B is formed on the bottom plate 41A. The side shield pattern 46A is an example of the side shield member. The bottom shield pattern 46B is an example of the bottom shield member.

In the first embodiment, the bottom shield pattern 46B is formed on the surface on the main board 20 side of the bottom plate 41A, that is, the lower surface 41Ab of the bottom plate 41A. The lower surface 41Ab of bottom plate 41A is an example of the third surface. In addition, in the first embodiment, the bottom shield pattern 46B is formed in all the regions except for the region where another electrode and a pattern wiring line (the terminal electrode 43 in the first embodiment) on the lower surface 41Ab are formed. In addition, in the first embodiment, the bottom shield pattern 46B is also formed on a part of the upper surface 41Aa of the bottom plate 41A.

In the first embodiment, the side shield pattern 46A is formed on the outer side surface 41Bb of the side plate 41B. In the first embodiment, the side shield pattern 46A is formed in the entire region of the outer side surface 41Bb. In the first embodiment, the side shield pattern 46A is also formed on a part of the inner side surface 41Ba of the side plate 41B. In the first embodiment, the side shield pattern 46A is connected to the bottom shield pattern 46B. In the first embodiment, the side shield pattern 46A is in contact with the upper film 61 of the shield film 60 from below. Accordingly, the side shield pattern 46A is electrically connected to the upper film 61 of the shield film 60.

It should be noted that the bottom shield pattern 46B may be formed only on one of the upper surface 41Aa and the lower surface 41Ab of the bottom plate 41A. The side shield pattern 46A may be formed only on one of the inner side surface 41Ba and the outer side surface 41Bb of the side plate 41B. In addition, the bottom shield pattern 46B and the side shield pattern 46A may be formed over the entire region of the formed surface, or may be formed over a partial region of the formed surface.

When the sub board 41 is a multilayer board of three or more layers, at least one of the bottom shield pattern 46B and the side shield pattern 46A may be formed on the inner layer surface of the sub board 41 (the inner layer surface 41Ac of the bottom plate 41A and the inner layer surface 41Bc of the side plate 41B). In FIG. 2, the inner layer surface 41Ac and the inner layer surface 41Bc are indicated by alternate long and short dash lines. An example in which the bottom shield pattern 46B is formed on the inner layer surface 41Ac of the bottom plate 41A and the side shield pattern 46A is formed on the inner layer surface 41Bc of the side plate 41B is indicated by broken lines in FIG. 2. Naturally, each of the side shield pattern 46A and the bottom shield pattern 46B may be formed on a plurality of surfaces of the sub board 41. For example, the side shield pattern 46A may be formed on the inner layer surface 41Bc and the outer side surface 41Bb of the side plate 41B.

A via conductor 45 is formed in the sub board 41. The via conductor 45 has the same configuration as the via conductor 24 formed on the main board 20. In the first embodiment, a plurality of via conductors 45 are formed in the sub board 41. Some of the plurality of via conductors 45 are formed in the bottom plate 41A, and electrically connect the terminal electrode 43 and the electrode 44. Another some of the plurality of via conductors 45 are formed in the side plate 41B, and electrically connect the side shield pattern 46A formed on the outer side surface 41Bb and the side shield pattern 46A formed on the inner side surface 41Ba.

As shown in FIGS. 1 and 2, the electronic components 30D and 30E are mounted on a surface on the opposite side from the main board 20 of the bottom plate 41A, that is, the upper surface 41Aa of the bottom plate 41A. In the first embodiment, the submodule 40 includes four electronic components 30D and one electronic component 30E. In the first embodiment, the electronic components 30D and 30E are interfered-system components affected by electromagnetic waves. The electronic component 30D is an inductor. The electronic component 30E is a low noise amplifier.

When the submodule 40 includes a low noise amplifier or a power amplifier as the electronic component 30, that is, when the low noise amplifier or the power amplifier is mounted on the sub board 41, heat can be dissipated from the low noise amplifier or the power amplifier to the shield film 60 through a short path by electrically connecting the low noise amplifier or the power amplifier to the shield pattern 46. On the other hand, when the low noise amplifier or the power amplifier is mounted on the main board 20, heat of the low noise amplifier or the power amplifier is dissipated from the shield film 60 or the terminal electrode 21. In this case, since heat of the low noise amplifier or the power amplifier is transmitted to the shield film 60 or the terminal electrode 21 through the pattern wiring line formed inside or on the front surface of the main board 20, the heat dissipation path becomes long. As described above, when the low noise amplifier or the power amplifier is mounted on the sub board 41, heat dissipation can be improved as compared with when the low noise amplifier or the power amplifier is mounted on the main board 20.

Figure 23:
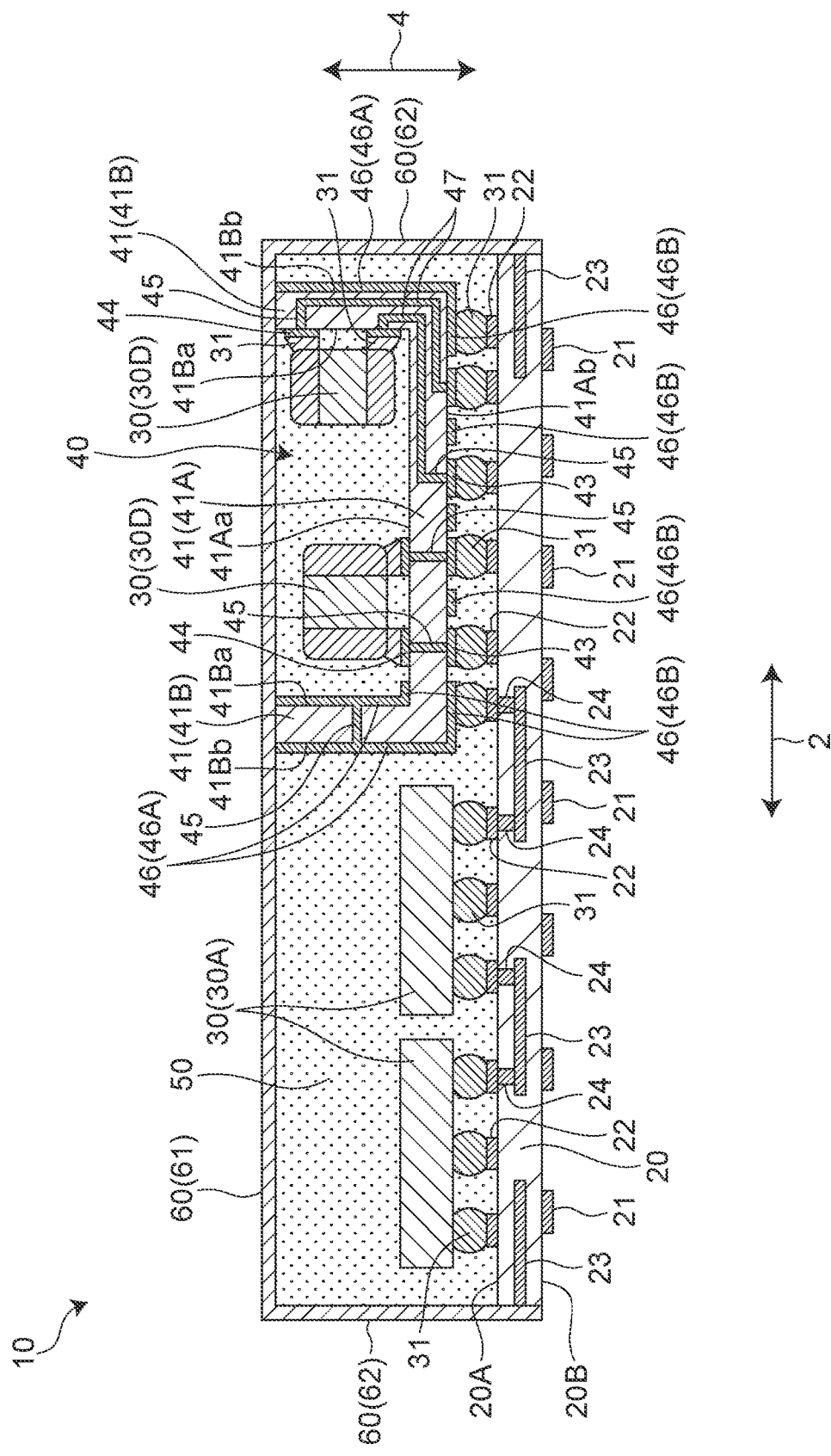
FIG. 23 is a cross-sectional view corresponding to a cross section taken along line A-A in FIG. 1 of a circuit module according to a modification of the first embodiment of the present disclosure.

It should be noted that the electronic components 30D and 30E may be mounted on the inner side surface 41Ba of the side plate 41B of the sub board 41, or may be mounted on both the upper surface 41Aa of the bottom plate 41A and the inner side surface 41Ba of the side plate 41B as shown in FIG. 23. FIG. 23 is a cross-sectional view corresponding to a cross section taken along line A-A in FIG. 1 of a circuit module according to a modification of the first embodiment of the present disclosure. In FIG. 23, of the illustrated two electronic components 30D, one electronic component 30D is mounted on the upper surface 41Aa of the bottom plate 41A, and the other electronic component 30D is mounted on the inner side surface 41Ba of the side plate 41B. The electronic component 30D mounted on the inner side surface 41Ba is electrically connected to the terminal electrode 43 through the via conductor 45 and the wiring pattern 47. In FIG. 23, the wiring pattern 47 is formed on the inner layer surface of the side plate 41B, but may be formed on the outer surface (for example, inner side surface 41Ba) of the side plate 41B. As described above, in the first embodiment, the electronic components 30D and 30E may be mounted on at least one of the inner side surface 41Ba of the side plate 41B and the upper surface 41Aa of the bottom plate 41A.

In addition, a component (for example, a resistor or a capacitor) less likely to generate electromagnetic waves and less likely to be affected by electromagnetic waves may be mounted on at least one of the upper surface 41Aa of the bottom plate 41A and the inner side surface 41Ba of the side plate 41B. In this case, the component is an example of the second electronic component as with the electronic components 30D and 30E. On the other hand, the interfering-system component is not mounted on the upper surface 41Aa of the bottom plate 41A or the inner side surface 41Ba of the side plate 41B. That is, at least some of the electronic components 30 to be mounted on the upper surface 41Aa of the bottom plate 41A and the inner side surface 41Ba of the side plate 41B are interfered-system components, and the electronic components 30 to be mounted on the upper surface 41Aa of the bottom plate 41A and the inner side surface 41Ba of the side plate 41B do not include interfering-system components. That is, in the first embodiment, the second electronic component includes the interfered-system component and does not include the interfering-system component.

The number of each of the electronic components 30D and 30E is not limited to the number shown in FIG. 1. At least one second electronic component only needs to be mounted on the sub board 41. In addition, as with the electronic components 30A, 30B, and 30C mounted on the upper surface 20A of the main board 20, electronic components 30D and 30E having various sizes and types can be mounted on the sub board 41. In addition, as a mounting method of the electronic components 30D and 30E, various known mounting methods can be adopted as with the mounting methods of the electronic components 30A, 30B, and 30C. In addition, the arrangement positions of the electronic components 30D and 30E are not limited to the arrangement positions shown in FIGS. 1 and 2.

According to the first embodiment, the electromagnetic wave passing through the sides of the electronic components 30D and 30E can be reduced by the side shield pattern 46A formed on the side plate 41B. The electromagnetic wave passing below the electronic components 30D and 30E can be reduced by the bottom shield pattern 46B formed on the bottom plate 41A.

According to the first embodiment, the bottom plate 41A and the side plate 41B are formed by bending one sub board 41. Therefore, the number of plates constituting the submodule 40 can be reduced.

According to the first embodiment, the side plate 41B is positioned between the electronic components 30A, 30B, and 30C and the electronic components 30D and 30E. Therefore, the influence of the electromagnetic wave between the electronic components 30A, 30B, and 30C and the electronic components 30D and 30E can be reduced by the side shield pattern 46A formed on the side plate 41B.

According to the first embodiment, the bottom shield pattern 46B and the side shield pattern 46A are connected to each other. Therefore, the electromagnetic wave passing between the bottom plate 41A and the side plate 41B can be reduced.

The lower surface 41Ab of the bottom plate 41A is positioned between the electronic components 30D and 30E and the main board 20. Therefore, according to the first embodiment, the electromagnetic wave passing between the main board 20 and the electronic components 30D and 30E can be reduced by the bottom shield pattern 46B formed on the lower surface 41Ab of the bottom plate 41A.

According to the first embodiment, the shield pattern 46 may be formed on the inner layer surface 41Ac. In this case, it is possible to enlarge the arrangeable regions of the electronic components 30D and 30E on the upper surface 41Aa of the bottom plate 41A and the inner side surface 41Ba of the side plate 41B. In addition, it is possible to enlarge an arrangeable region of the terminal electrode 43 to be provided on the lower surface 41Ab of the bottom plate 41A in order to be mounted on the main board 20.

According to the first embodiment, the shield pattern 46 can reduce the influence of the electromagnetic wave generated in the electronic component 30A on the electronic components 30D and 30E provided in the submodule 40.

According to the first embodiment, the side shield pattern 46A formed on the side plate 41B is connected to the upper film 61 of the shield film 60 covering the upper part of the sealing resin 50. Therefore, the electromagnetic wave passing between the upper end portion of the side plate 41B and the upper film 61 covering the upper part of the sealing resin 50 can be reduced.

Method for Manufacturing Circuit Module of First Embodiment

Hereinafter, a method for manufacturing the circuit module 10 of the first embodiment will be described with reference to FIGS. 4 to 8 and FIG. 2.

Figure 4:
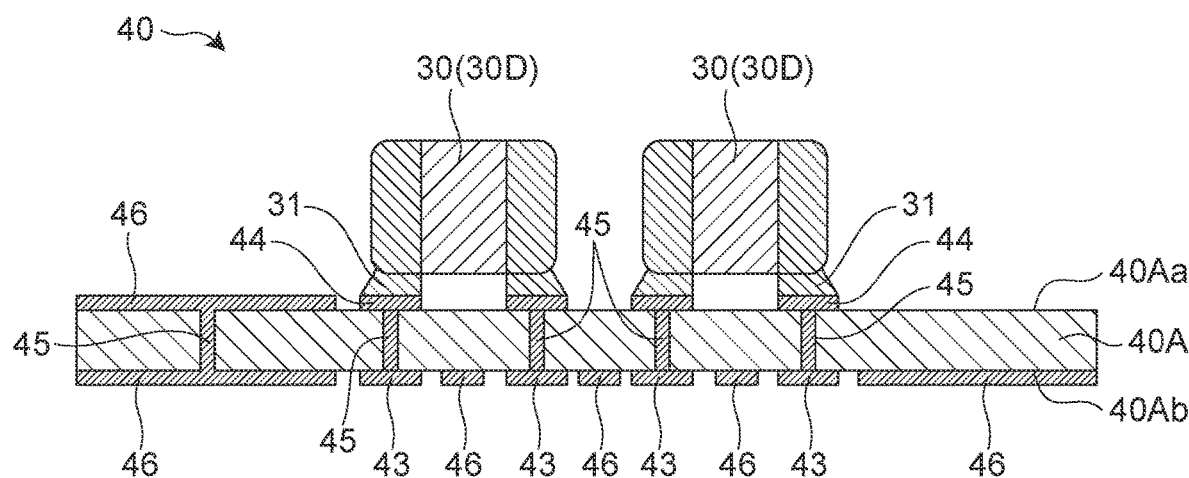
FIG. 4 is a cross-sectional view of a submodule in a state in which an electronic component is mounted on a sub board of a submodule in a method for manufacturing a circuit module according to the first embodiment of the present disclosure.
Figure 5:
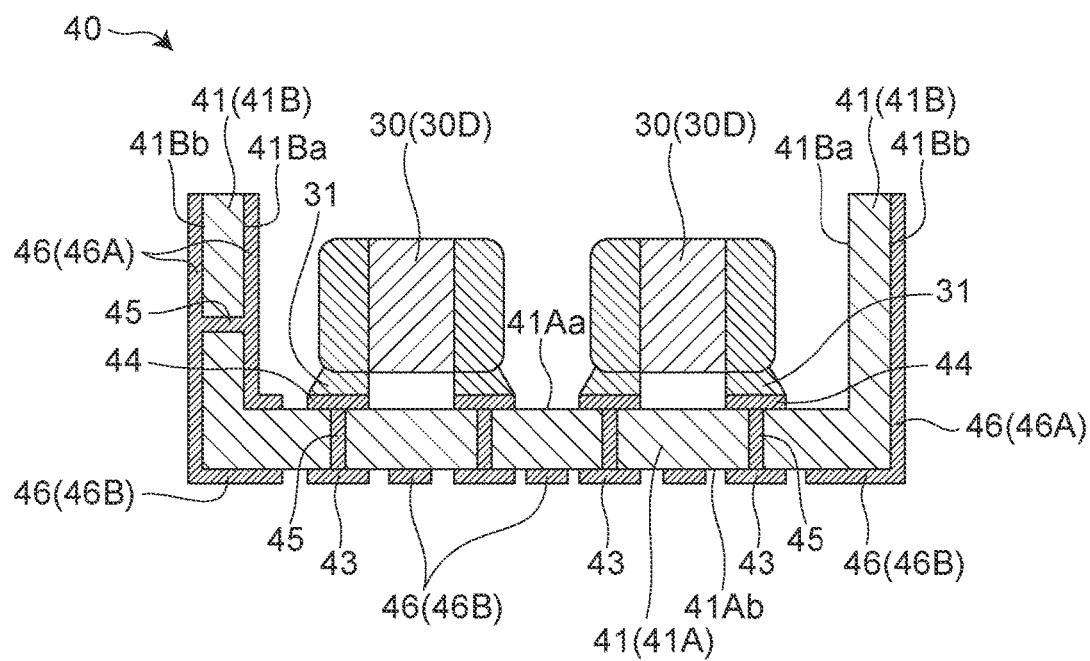
FIG. 5 is a cross-sectional view of the submodule in a state where the sub board in FIG. 4 is bent.
Figure 6:
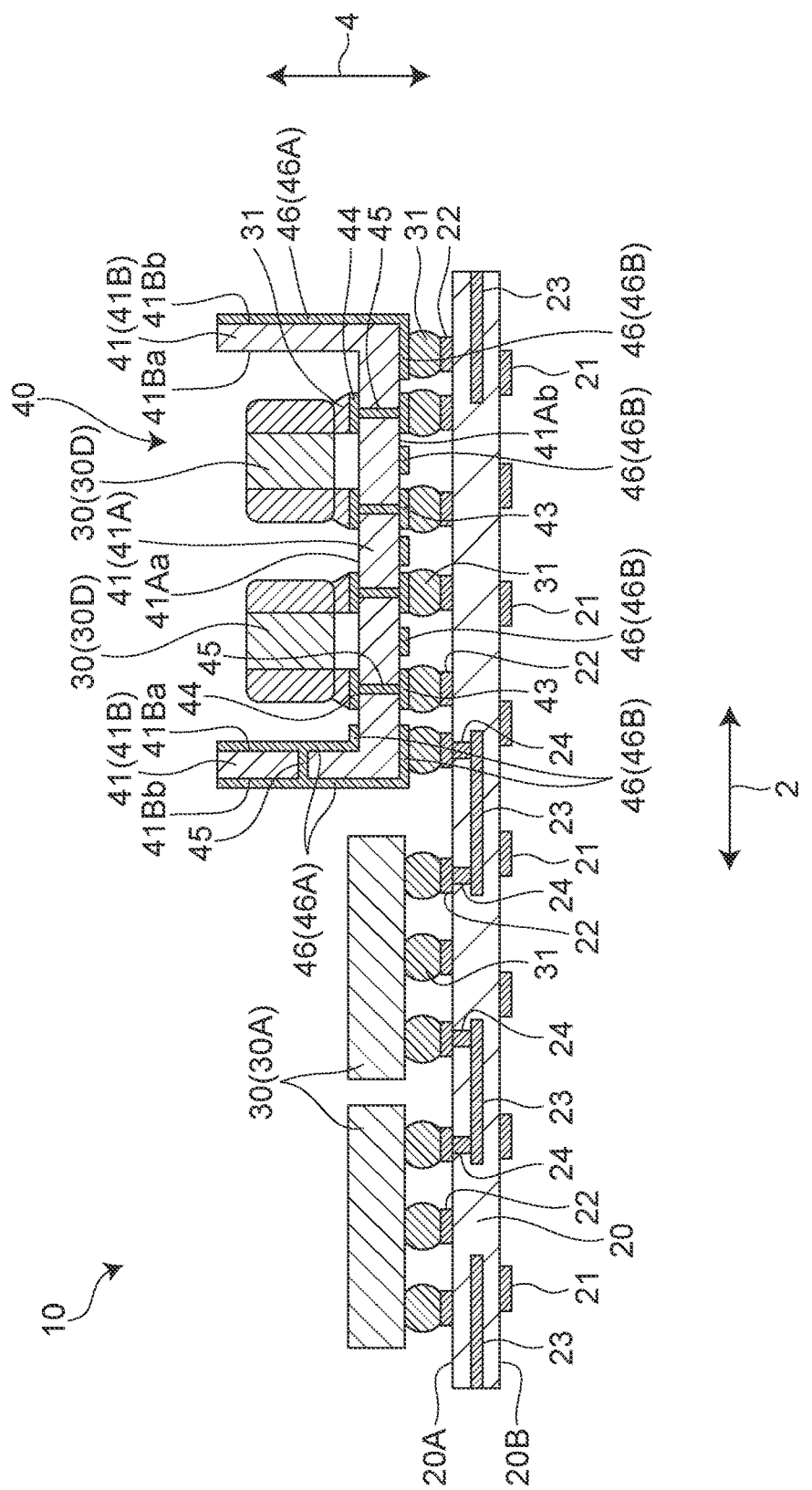
FIG. 6 is a cross-sectional view of the circuit module in a state where the submodule in FIG. 5 is mounted on the main board.
Figure 7:
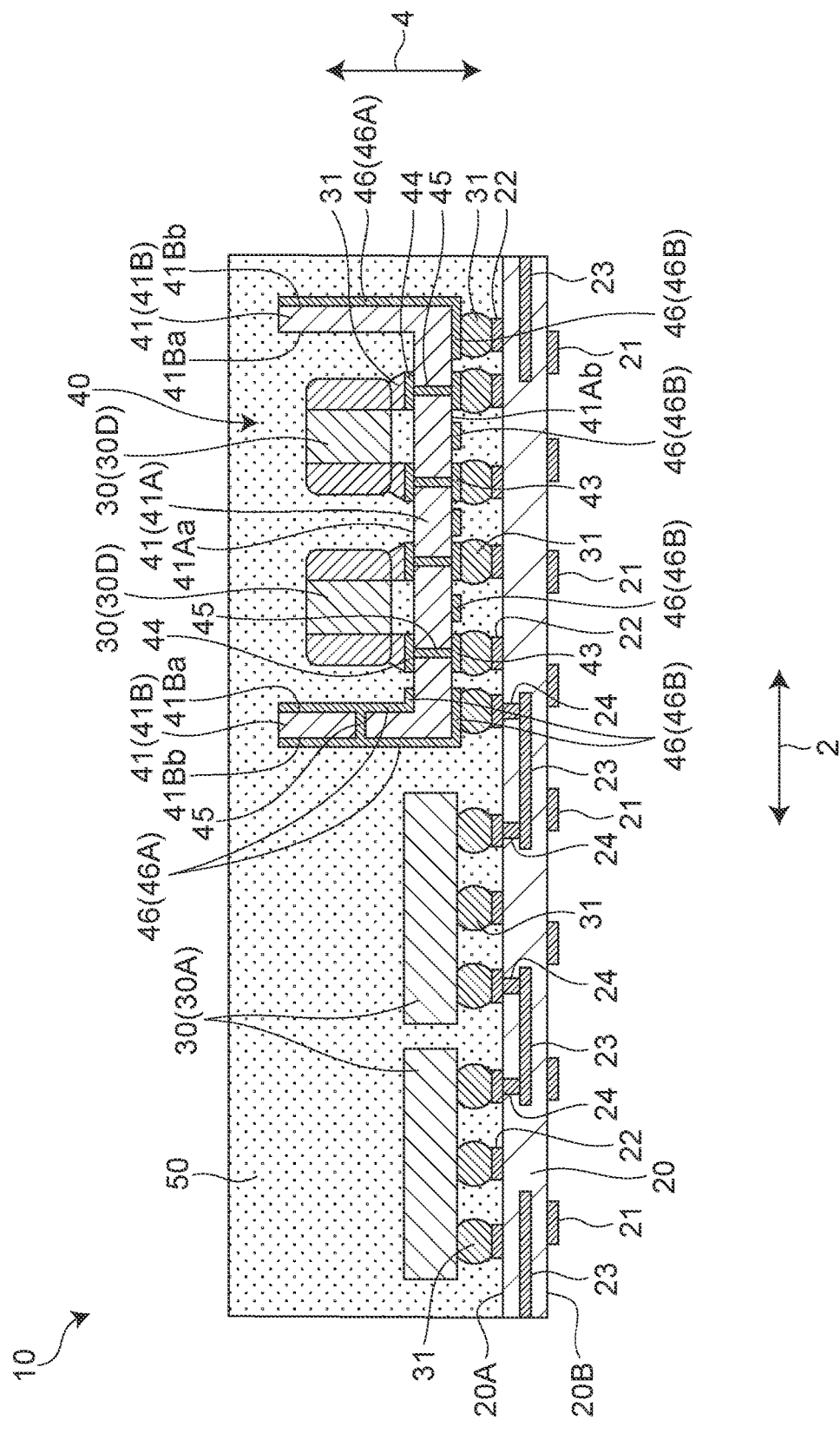
FIG. 7 is a cross-sectional view of the circuit module in a state in which the electronic component and the submodule in FIG. 6 are covered with a sealing resin.
Figure 8:
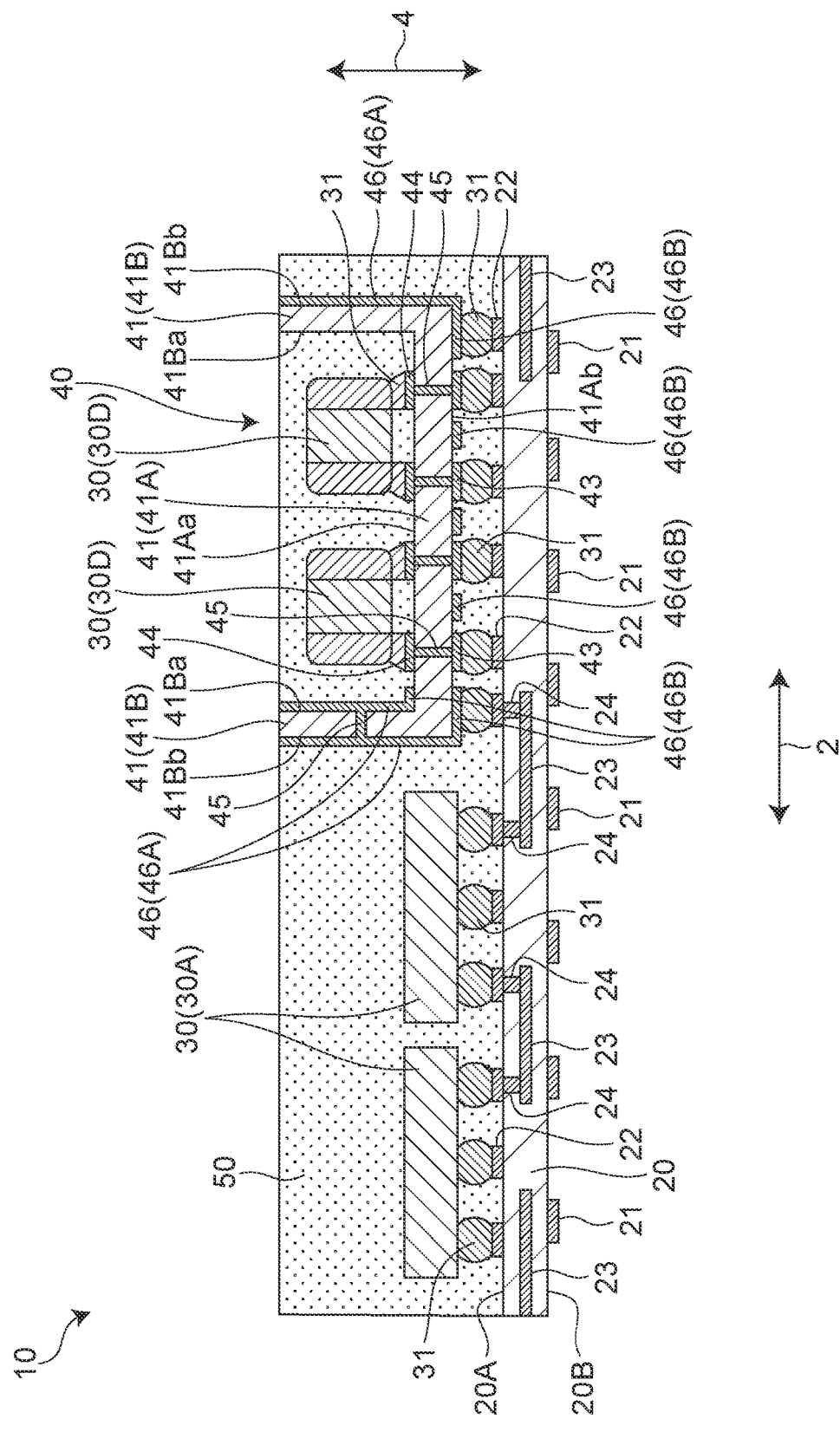
FIG. 8 is a cross-sectional view of the circuit module in a state where the upper portion of the sealing resin in FIG. 7 is polished.

FIG. 4 is a cross-sectional view of a submodule in a state in which an electronic component is mounted on a sub board of a submodule in a method for manufacturing a circuit module according to the first embodiment of the present disclosure. FIG. 5 is a cross-sectional view of the submodule in a state where the sub board in FIG. 4 is bent. FIG. 6 is a cross-sectional view of the circuit module in a state where the submodule in FIG. 5 is mounted on the main board. FIG. 7 is a cross-sectional view of the circuit module in a state in which the electronic component and the submodule in FIG. 6 are covered with a sealing resin. FIG. 8 is a cross-sectional view of the circuit module in a state where the upper portion of the sealing resin in FIG. 7 is polished.

First, a first mounting step is performed. In the first mounting step, as shown in FIG. 4, the electronic components 30D and 30E are mounted on the two-layer sub board 41 (flexible board) on which the terminal electrode 43, the electrode 44, the via conductor 45, and the shield pattern 46 are formed. It should be noted that in FIGS. 4 to 8 and 2, only the electronic component 30D of the electronic components 30D and 30E is illustrated. The electronic components 30D and 30E are mounted on the electrode 44. As the mounting method, various known mounting methods such as flip chip and wire bonding are adopted. It should be noted that the two-layer sub board 41 is manufactured by a known means.

Next, a bending step is performed. In the bending step, as shown in FIG. 5, the sub board 41 is bent. It should be noted that the sub board 41 is not limited to be bent with a crease as shown in FIG. 5, and may be curved without a crease. The submodule 40 is completed by performing the bending step.

Next, a second mounting step is performed. In the second mounting step, as shown in FIG. 6, the electronic components 30A, 30B, and 30C and the submodule 40 after being subjected to the bending step shown in FIG. 5 are mounted on the three-layer main board 20 on which the terminal electrode 21, the electrode 22, and the pattern wiring line 23 are formed. It should be noted that in FIGS. 6 to 8 and 2, only the electronic component 30A of the electronic components 30A, 30B, and 30C is illustrated. The electronic components 30A, 30B, and 30C and the submodule 40 are mounted on the electrode 22. As the mounting method, various known mounting methods such as flip chip and wire bonding are adopted as in the first mounting step. It should be noted that the three-layer main board 20 is manufactured by a known means.

Next, a covering step is performed. In the covering step, as shown in FIG. 7, the electronic components 30A, 30B, and 30C and the submodule 40 mounted on the main board 20 in the second mounting step are covered with the sealing resin 50. Covering of the electronic components 30A, 30B, and 30C and the submodule 40 with the sealing resin 50 is performed by a known means such as a transfer mold or a compression mold. In FIG. 7, the electronic components 30A, 30B, and 30C and the submodule 40 are completely buried in the sealing resin 50.

Next, a polishing step is performed. In the polishing step, the upper portion of the sealing resin 50 shown in FIG. 7 is polished and removed. Accordingly, as shown in FIG. 8, the upper end portion of the submodule 40, that is, the upper end portion of the side plate 41B is exposed upward. In the first embodiment, the upper end portion of the side shield pattern 46A formed on the side plate 41B is also exposed upward. It should be noted that as the means for removing the upper portion of the sealing resin 50, various known means can be adopted, not limited to polishing.

Next, a shield film forming step is performed. In the shield film forming step, a metal film is formed by sputtering, plating, or the like, for example, to form the shield film 60. A resin containing a conductive material as a filler may be applied. In addition, the shield film 60 may have a configuration in which a plurality of types of materials are laminated in a plurality of layers. By forming the shield film 60, as shown in FIG. 2, the side plate 41B and the side shield pattern 46A formed on the side plate 41B come into contact with the upper film 61 of the shield film 60. Accordingly, the circuit module 10 is completed.

In the first embodiment, the shield pattern 46 formed on the sub board 41 by a means such as printing corresponds to the shield member, but the shield member is not limited thereto. For example, the shield member may be a metal plate attached to the sub board 41.

Each of the bottom plate 41A and the side plate 41B is not limited to the shape shown in FIG. 2. For example, the side plate 41B may have a triangular shape in a side view (when viewed along the longitudinal direction 2).

In the first embodiment, the sub board 41 has a box shape with the upper side open, but not limited to the box shape. For example, the sub board 41 may have various shapes as shown in FIGS. 9 to 14. FIGS. 9 to 14 are perspective views showing examples of the shape of the sub board of the submodule.

Figure 9:
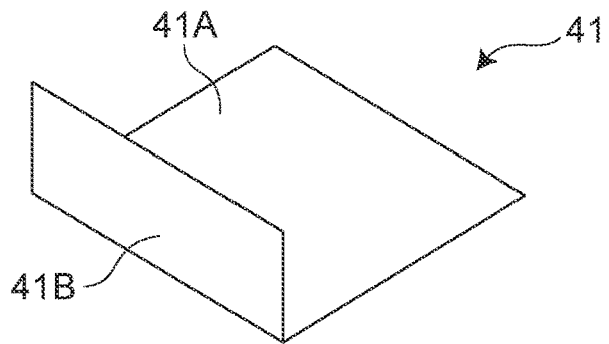
FIG. 9 is a perspective view showing an example of the shape of the sub board of the submodule.
Figure 10:
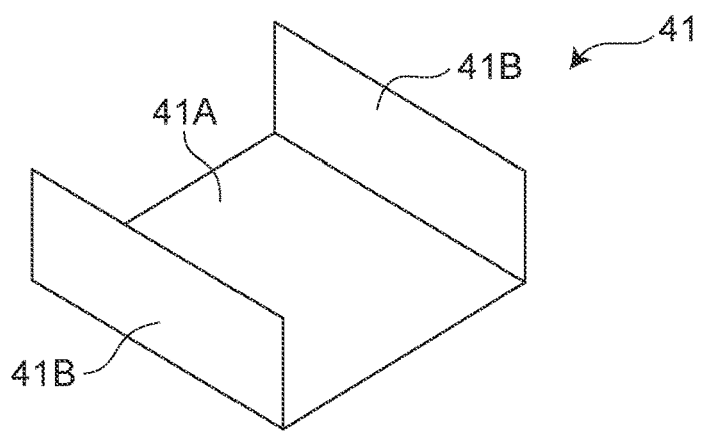
FIG. 10 is a perspective view showing an example of the shape of the sub board of the submodule.
Figure 11:
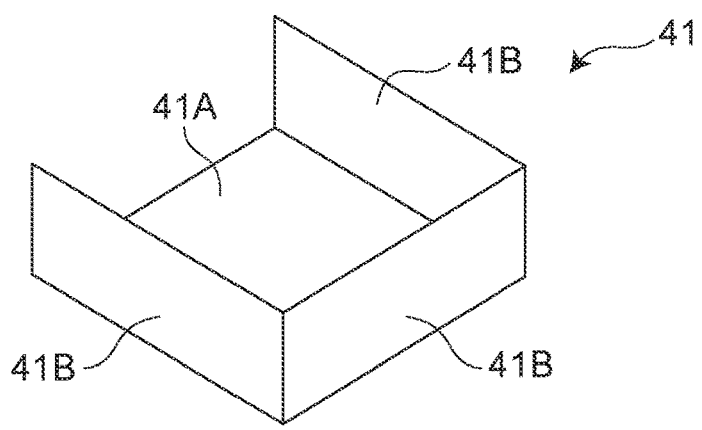
FIG. 11 is a perspective view showing an example of the shape of the sub board of the submodule.

The sub board 41 shown in FIG. 9 includes a bottom plate 41A having a rectangular shape in a plan view and a side plate 41B extending upward from one side of the bottom plate 41A. The sub board 41 shown in FIG. 10 includes a bottom plate 41A having a rectangular shape in a plan view and a side plate 41B extending upward from two sides facing each other of the bottom plate 41A. The sub board 41 shown in FIG. 11 includes a bottom plate 41A having a rectangular shape in a plan view and a side plate 41B extending upward from three sides of the bottom plate 41A.

Figure 12:
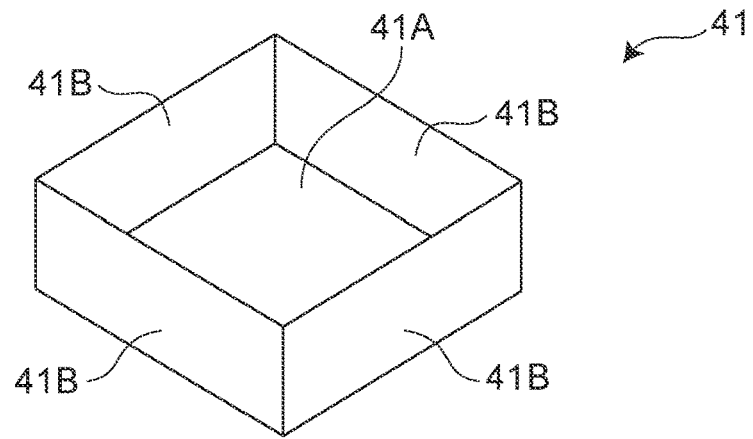
FIG. 12 is a perspective view showing an example of the shape of the sub board of the submodule.

The sub board 41 shown in FIG. 12 includes a bottom plate 41A having a rectangular shape in a plan view and a side plate 41B extending upward from four sides (all sides) of the bottom plate 41A. That is, the sub board 41 shown in FIG. 12 has the same shape as the sub board 41 shown in FIGS. 1 and 2.

Figure 13:
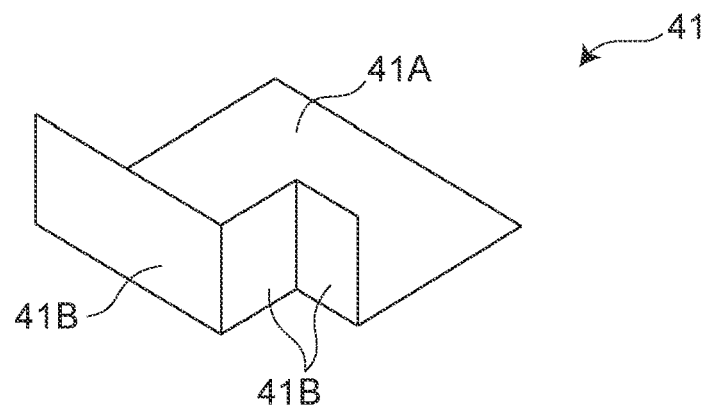
FIG. 13 is a perspective view showing an example of the shape of the sub board of the submodule.

The sub board 41 shown in FIG. 13 includes a hexagonal bottom plate 41A in a plan view, and a side plate 41B bent by extending upward from three continuous sides of the bottom plate 41A.

Figure 14:
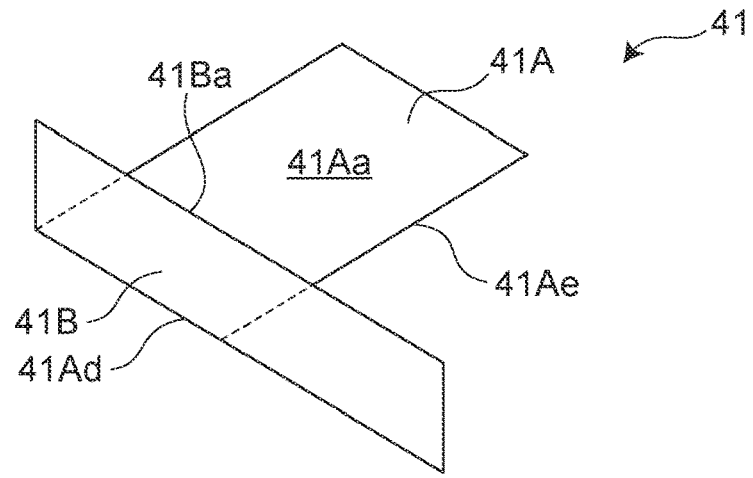
FIG. 14 is a perspective view showing an example of the shape of the sub board of the submodule.

The sub board 41 shown in FIG. 14 includes a bottom plate 41A having a rectangular shape in a plan view and a side plate 41B extending upward from the first side 41Ad of the bottom plate 41A. As shown in FIG. 14, in a plan view, the side plate 41B extends to the opposite side of the first side 41Ad with respect to the second side 41Ae continuous with the first side 41Ad of the bottom plate 41A. In other words, in a plan view, the inner side surface 41Ba of the side plate 41B extends outward from the upper surface 41Aa along the first side 41Ad of the upper surface 41Aa of the bottom plate 41A.

According to the configuration shown in FIG. 14, it is possible to increase the region where the electromagnetic wave can be shielded.

Second Embodiment

Figure 15:
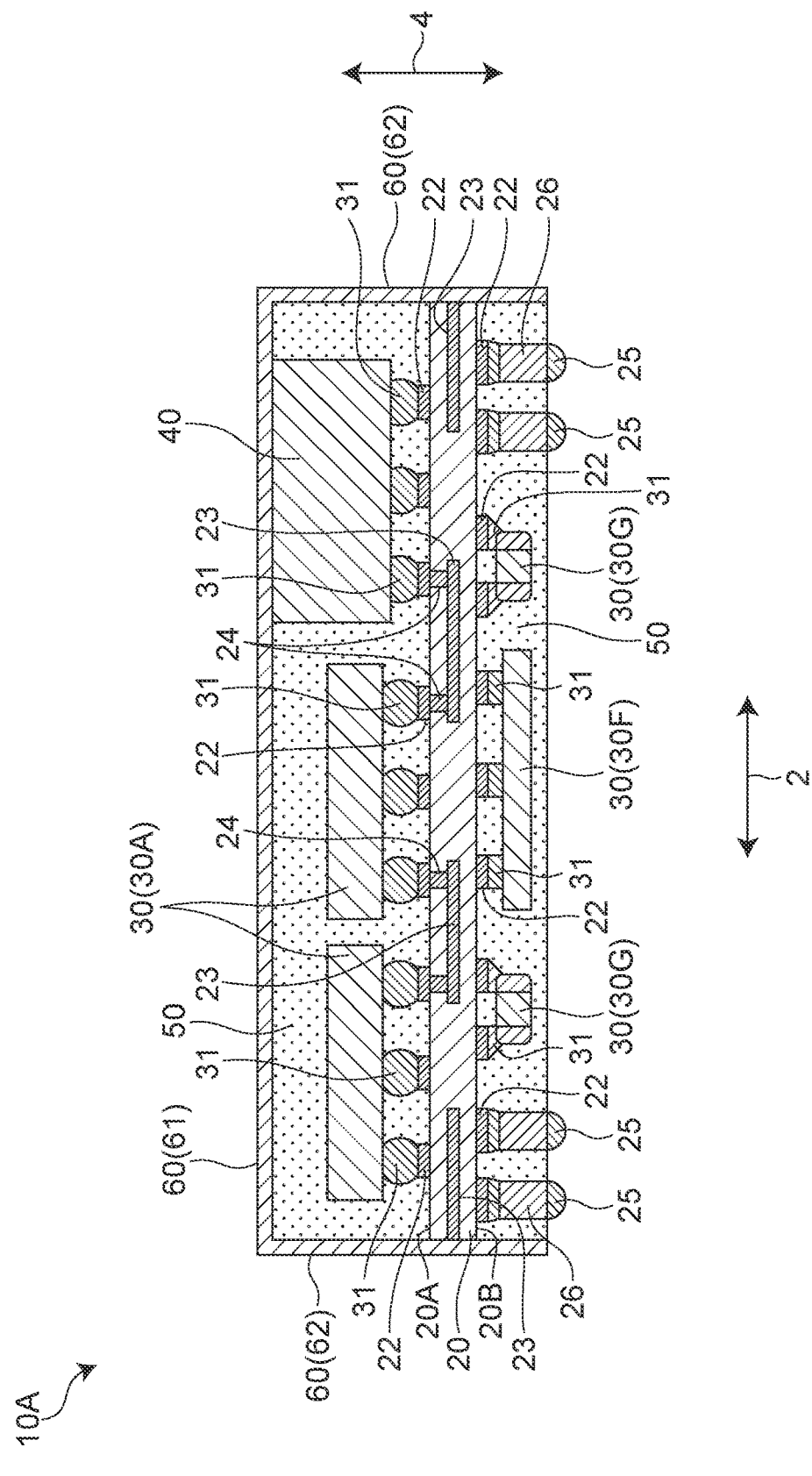
FIG. 15 is a longitudinal sectional view of a circuit module according to a second embodiment of the present disclosure.

FIG. 15 is a longitudinal sectional view of a circuit module according to a second embodiment of the present disclosure. The circuit module 10A according to the second embodiment is different from the circuit module 10 according to the first embodiment in that the electronic component 30 and the sealing resin 50 are provided not only on the upper surface 20A but also on the lower surface 20B of the main board 20.

As shown in FIG. 15, an electrode 22 is formed on a lower surface 20B of the main board 20 of the circuit module 10A. The columnar conductor 26 is electrically connected to the electrode 22 formed on the lower surface 20B through the conductive member 31.

In addition, the electronic components 30F and 30G are electrically connected to the electrode 22 formed on the lower surface 20B through the conductive member 31. That is, one electronic component 30F and two electronic components 30G are mounted on the lower surface 20B. In the second embodiment, the electronic component 30F is an interfering-system component that generates electromagnetic waves, and the electronic components 30B and 30C are components less likely to generate electromagnetic waves and less likely to be affected by electromagnetic waves. In the second embodiment, in addition to the electronic components 30A, 30B, and 30C, the electronic components 30F and 30G are also examples of the first electronic component. It should be noted that the number and types of the electronic components 30 mounted on the lower surface 20B are not limited to the number and types of the electronic components 30F and 30G described above. In addition, in the circuit module 10A, the submodule 40 is mounted on the upper surface 20A of the main board 20, but may be mounted on the lower surface 20B of the main board 20, or may be mounted on both the upper surface 20A and the lower surface 20B.

The sealing resin 50 is provided not only on the upper surface 20A of the main board 20 but also on the lower surface 20B of the main board 20. The sealing resin 50 covers the conductor 26 and the electronic components 30F and 30G. However, the tip surface (lower surface) of the conductor 26 is exposed to the outside.

The terminal electrode 25 is connected to a lower surface of the conductor 26 exposed to the outside. When the circuit module 10A is mounted on a board or the like (not shown), the terminal electrode 25 is connected to an electrode formed on the board or the like.

Third Embodiment

Figure 16:
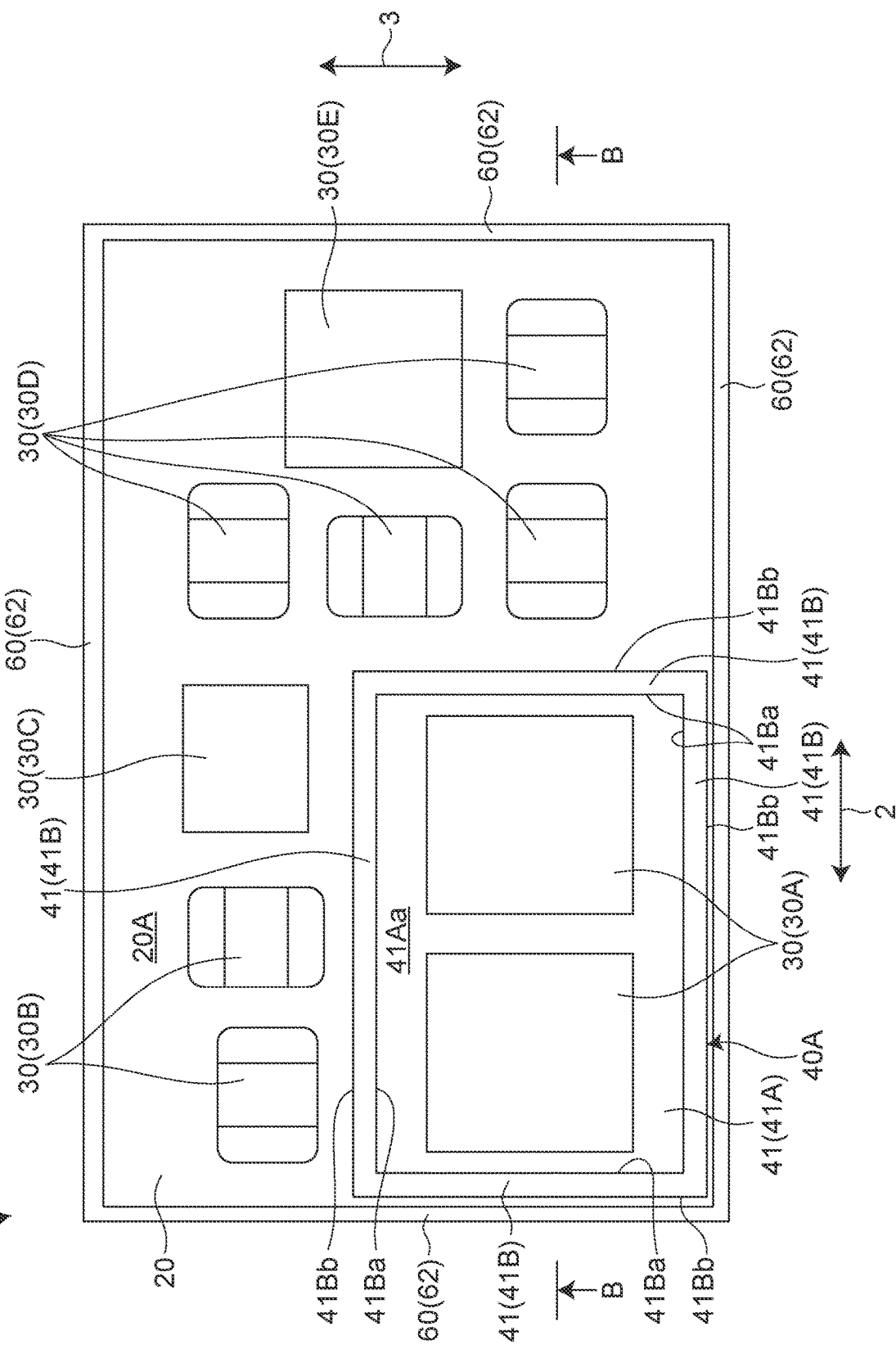
FIG. 16 is a plan view of a circuit module according to a third embodiment of the present disclosure.

FIG. 16 is a plan view of a circuit module according to a third embodiment of the present disclosure. FIG. 17 is a cross-sectional view taken along line B-B in FIG. 16. The circuit module 10B according to the third embodiment is different from the circuit module 10 according to the first embodiment in that a submodule 40A includes an electronic component 30A being an interfering-system component.

As shown in FIG. 16, the circuit module 10B includes a main board 20, an electronic component 30, a submodule 40A, a sealing resin 50, and a shield film 60. In the second embodiment, the electronic components 30B, 30C, 30D, and 30E are mounted on the main board 20. The electronic component 30A is mounted on the submodule 40A. In the third embodiment, the electronic components 30B, 30C, 30D, and 30E are examples of the first electronic component. As described above, the electronic component 30A is an interfering-system component, the electronic components 30D and 30E are interfered-system components, and the electronic components 30B and 30C are components less likely to generate electromagnetic waves and less likely to be affected by electromagnetic waves.

It should be noted that only the interfered-system components may be mounted on the main board 20. That is, at least some of the electronic components 30 mounted on the main board 20 may be interfered-system components. That is, in the third embodiment, the first electronic component only needs to include an interfered-system component.

As shown in FIGS. 16 and 17, the submodule 40A includes a sub board 41 and two electronic components 30A. In the third embodiment, the electronic component 30A is an example of the second electronic component.

It should be noted that in the third embodiment, as with the electronic components 30D and 30E in the first embodiment, the electronic component 30A only needs to be mounted on at least one of the inner side surface 41Ba of the side plate 41B and the upper surface 41Aa of the bottom plate 41A.

In addition, a component (for example, a resistor or a capacitor) less likely to generate electromagnetic waves and less likely to be affected by electromagnetic waves may be mounted on at least one of the upper surface 41Aa of the bottom plate 41A and the inner side surface 41Ba of the side plate 41B. In this case, the component is an example of the second electronic component as with the electronic component 30A. On the other hand, the interfered-system component is not mounted on the upper surface 41Aa of the bottom plate 41A or the inner side surface 41Ba of the side plate 41B. That is, at least some of the electronic components 30 to be mounted on the upper surface 41Aa of the bottom plate 41A and the inner side surface 41Ba of the side plate 41B are interfering-system components, and the electronic components 30 to be mounted on the upper surface 41Aa of the bottom plate 41A and the inner side surface 41Ba of the side plate 41B do not include interfered-system components. That is, in the third embodiment, the second electronic component only needs to include the interfering-system component and only needs not to include the interfered-system component.

It should be noted that as in the first embodiment, the number, type, and mounting method of each of the electronic components 30A to 30E are not limited to the number and type shown in FIG. 1.

According to the third embodiment, the shield pattern 46 can reduce the influence of the electromagnetic wave generated in the electronic component 30A on the electronic components 30D and 30E positioned outside the submodule 40A.

Fourth Embodiment

Figure 18A:
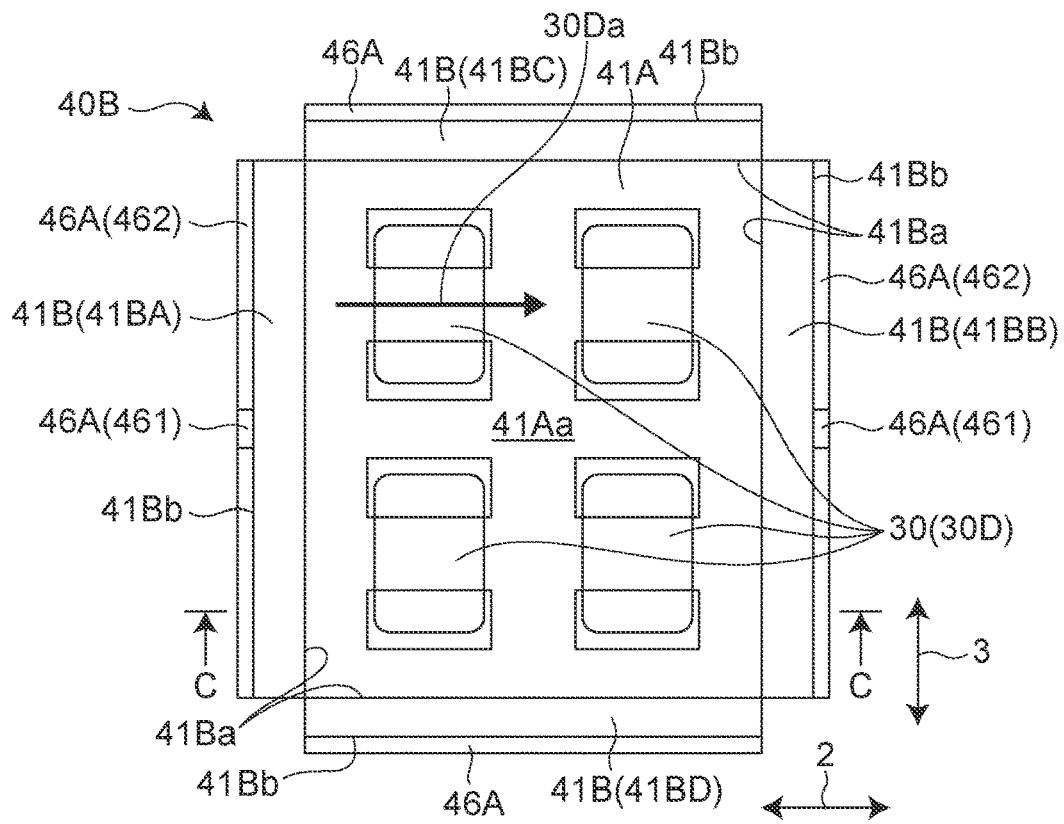
FIG. 18A is a plan view of a submodule included in a circuit module according to a fourth embodiment of the present disclosure.
Figure 18B:
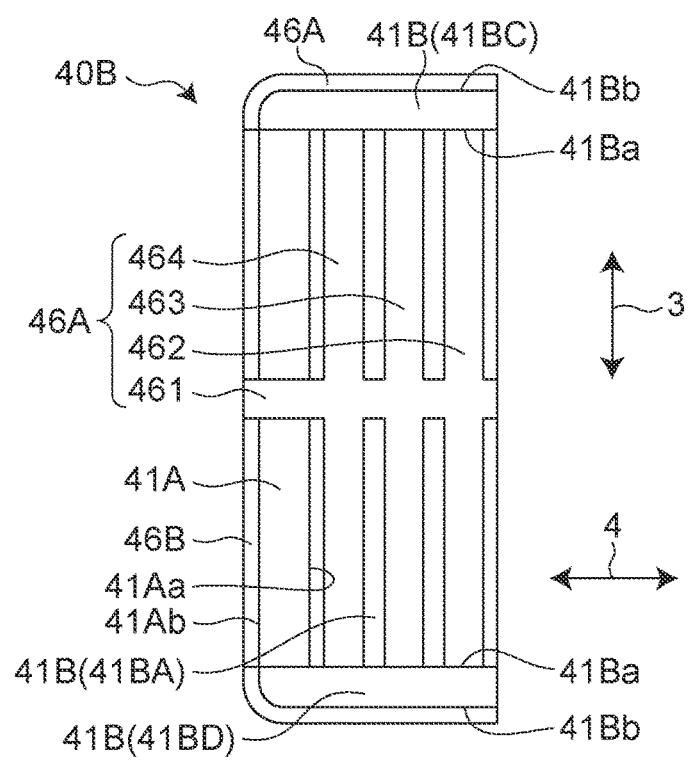
FIG. 18B is a left side view of the submodule included in the circuit module according to the fourth embodiment of the present disclosure.
Figure 18C:
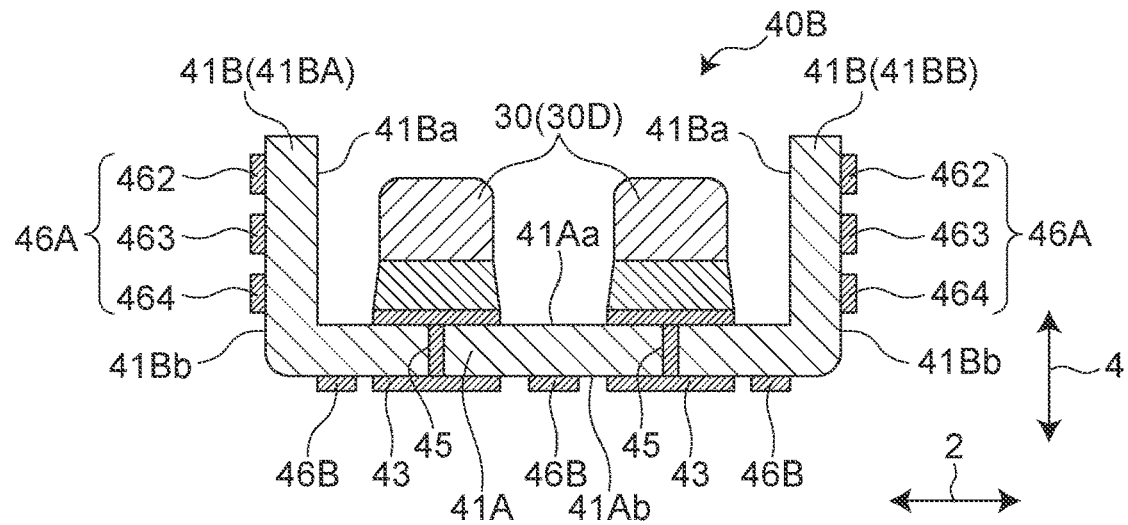
FIG. 18C is a cross-sectional view taken along line C-C in FIG. 18A.
Figure 18D:
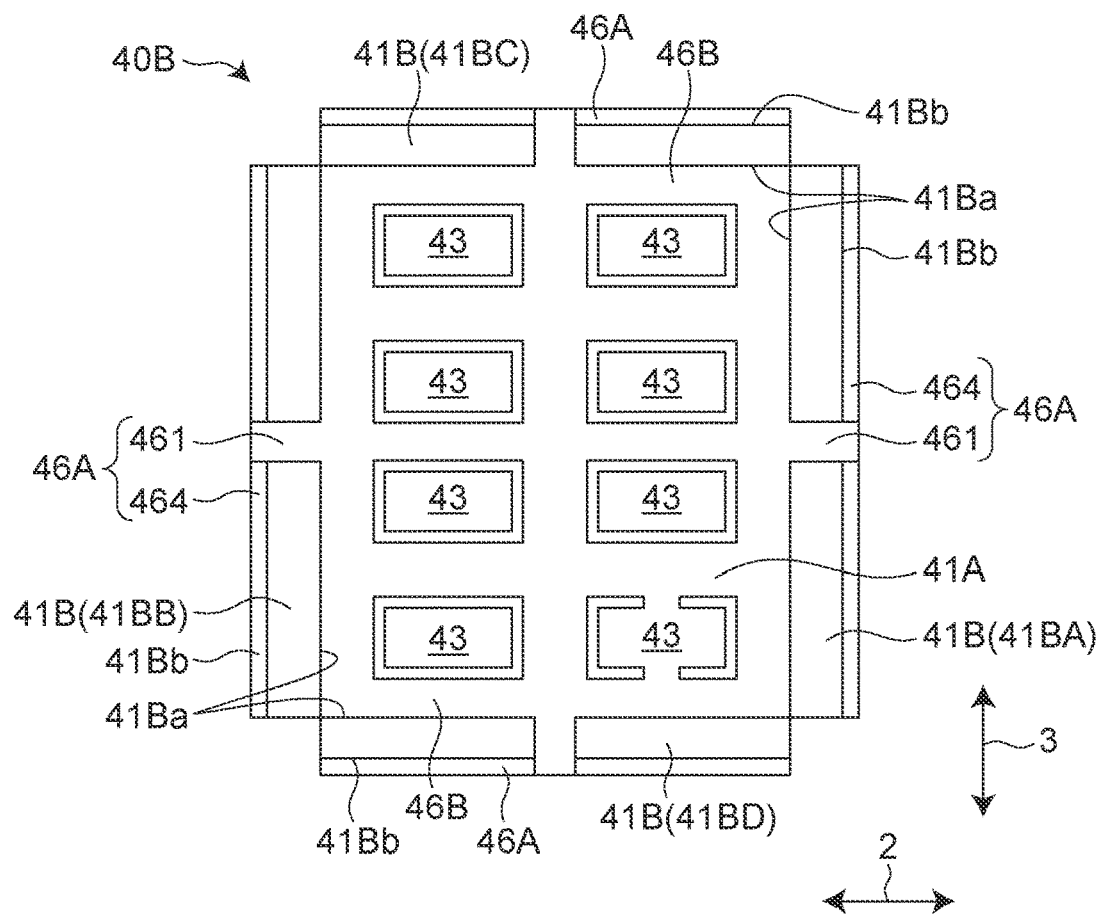
FIG. 18D is a bottom view of the submodule included in the circuit module according to the fourth embodiment of the present disclosure.

FIG. 18A is a plan view of a submodule included in a circuit module according to a fourth embodiment of the present disclosure. FIG. 18B is a left side view of the submodule included in the circuit module according to the fourth embodiment of the present disclosure. FIG. 18C is a cross-sectional view taken along line C-C in FIG. 18A. FIG. 18D is a bottom view of the submodule included in the circuit module according to the fourth embodiment of the present disclosure. The circuit module according to the fourth embodiment is different from the circuit module 10 according to the first embodiment in that a submodule 40B is provided instead of the submodule 40.

As shown in FIGS. 18A to 18D, the submodule 40B includes a sub board 41 and four electronic components 30D. In the fourth embodiment, the electronic component 30D is an example of the second electronic component.

The electronic component 30D is an inductor. In the fourth embodiment, as indicated by an arrow in FIG. 18A, the winding axis 30Da of the electronic component 30D extends in the longitudinal direction 2 parallel to the upper surface 41Aa of the sub board 41. In FIG. 18A, only one of the four electronic components 30D has the winding axis 30Da illustrated, but the winding axes 30Da of the other three electronic components 30D also extend in the same direction as the illustrated winding axis 30Da. It should be noted that the winding axes 30Da of the respective electronic components 30D may extend in different directions. Inside the electronic component 30D, a coil is disposed around the winding axis 30Da.

The sub board 41 includes a bottom plate 41A and a side plate 41B. The side plate 41B includes four side plates 41BA to 41BD. Each of the side plates 41BA to 41BD extends upward from each side of the bottom plate 41A. The side plates 41BA and 41BB face each other. The side plates 41BC and 41BD face each other. The side plates 41BA and 41BB are orthogonal to the winding axis 30Da of the electronic component 30D. The bottom plate 41A and the side plates 41BC and 41BD are parallel to the winding axis 30Da of the electronic component 30D.

As shown in FIGS. 18B and 18C, the side shield pattern 46A formed on the outer side surface 41Bb of the side plate 41BA has four linear conductor portions 461, 462, 463, and 464. It should be noted that in the fourth embodiment, the side shield pattern 46A formed on the side plate 41BB has the same configuration as the side shield pattern 46A formed on the side plate 41BA.

The linear conductor portion 461 extends in the height direction 4. The linear conductor portions 462, 463, and 464 extend in the lateral direction 3. The linear conductor portions 462, 463, and 464 are formed at intervals from each other in the height direction 4. That is, the linear conductor portions 462, 463, and 464 are formed side by side in a stripe shape. The linear conductor portion 462 is positioned above the linear conductor portion 463. The linear conductor portion 463 is positioned above the linear conductor portion 464. The linear conductor portions 462, 463, and 464 intersect with the linear conductor portion 461 and are connected to the linear conductor portion 461. Each of the linear conductor portions 462, 463, and 464 is connected only to the linear conductor portion 461, and the linear conductor portion 461 is connected only to the linear conductor portions 462, 463, and 464. With the above configuration, the linear conductor portions 461, 462, 463, and 464 have non-loop shapes. The linear conductor portions 461, 462, 463, and 464 are examples of a non-loop portion.

The side shield patterns 46A formed on the side plates 41BC and 41BD are formed in the entire region of the side plates 41BC and 41BD. It should be noted that the side shield patterns 46A formed on the side plates 41BC and 41BD may include a loop shape or a non-loop shape.

As shown in FIG. 18D, the bottom shield pattern 46B formed on the bottom plate 41A is formed so as to surround the terminal electrode 43 at a distance from the terminal electrode 43. That is, the bottom shield pattern 46B includes a loop shape. It should be noted that in FIG. 18D, one of a total of eight terminal electrodes 43 electrically connected to the four electronic components 30D is connected to the bottom shield pattern 46B. It should be noted that the bottom shield pattern 46B does not need to include a loop shape.

If the shield pattern 46 formed on the bottom plate 41A or the side plate 41B intersecting the winding axis 30Da of the inductor (electronic component 30D) has a loop shape, an eddy current is generated in the shield pattern 46 having a loop shape. By the magnetic field generated by the eddy current affecting the inductor of the interfered-system component, characteristics of the inductor may be deteriorated. However, according to the fourth embodiment, the shield pattern 46 has non-loop shaped non-loop portions (linear conductor portions 461, 462, 463, and 464) in the side plates 41BA and 41BB intersecting the winding axis 30Da of the inductor. Therefore, deterioration as described above of the characteristics of the inductor can be reduced.

According to the fourth embodiment, the non-loop portion includes a plurality of linear conductor portions 462, 463, and 464 formed side by side in a stripe shape. Accordingly, a region for forming a pattern wiring line through which a signal passes or an electrode can be secured in a region between two adjacent linear conductor portions of the linear conductor portions 462, 463, and 464.

In the fourth embodiment, the side plates 41BA and 41BB having the non-loop-shaped side shield patterns 46A are orthogonal to the winding axis 30Da of the electronic component 30D, but only need to intersect the winding axis 30Da, not limited to be orthogonal.

In the fourth embodiment, the non-loop portion includes four linear conductor portions 461, 462, 463, and 464 as shown in FIG. 18B. However, the non-loop portion only needs to have a non-loop shape, and is not limited to the shape shown in FIG. 18B.

Figure 19:
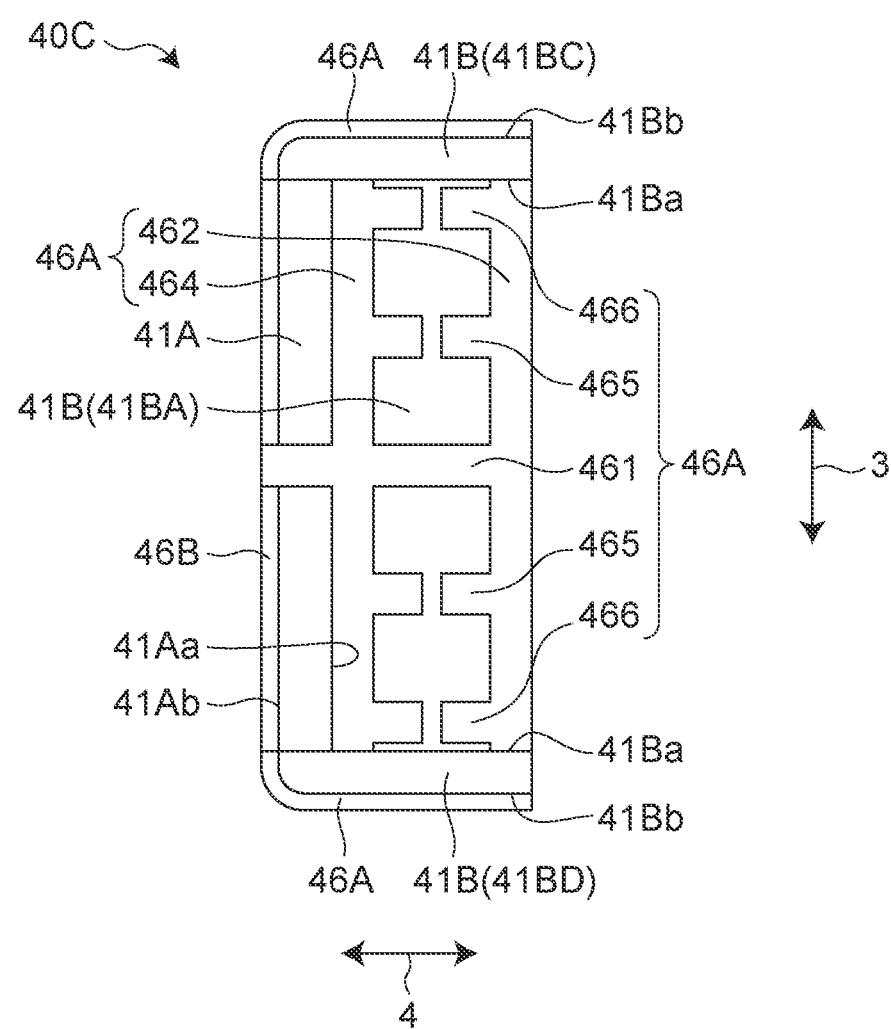
FIG. 19 is a left side view of a modification of the submodule included in the circuit module according to the fourth embodiment of the present disclosure.

For example, the non-loop portion may have a shape shown in FIG. 19. FIG. 19 is a left side view of a modification of the submodule included in the circuit module according to the fourth embodiment of the present disclosure.

As shown in FIG. 19, in the submodule 40C of the modification, the side shield pattern 46A formed in the side plate 41BA includes one for each of the linear conductor portions 461, 462, and 464 and two for each of the linear conductor portions 465 and 466. The linear conductor portions 461, 462, and 464 have the same configuration as those shown in FIGS. 18A to 18D. The linear conductor portions 465 and 466 extend in the height direction 4. One end portions of the linear conductor portions 465 and 466 are connected to the linear conductor portion 462. The other end portions of the linear conductor portions 465 and 466 are connected to the linear conductor portion 464. However, each of the linear conductor portions 465 and 466 is divided into two portions between the one end portion and the other end portion. With the above configuration, the side shield pattern 46A including the linear conductor portions 461, 462, 464, 465, and 466 has a non-loop shape. In this case, the linear conductor portions 461, 462, 464, 465, and 466 are examples of a non-loop portion.

In the fourth embodiment, the winding axis 30Da of the electronic component 30D extends in the longitudinal direction 2. However, the direction of the winding axis 30Da is not limited to the longitudinal direction 2. For example, the winding axis 30Da may extend in a direction inclined with respect to the longitudinal direction 2 in a plan view. In addition, for example, the winding axis 30Da may extend in the lateral direction 3. In this case, since the winding axis 30Da is orthogonal to the side plates 41BC and 41BD, the side shield patterns 46A formed on the side plates 41BC and 41BD have a non-loop shape. In addition, for example, the winding axis 30Da may extend in the height direction 4. In this case, since the winding axis 30Da is orthogonal to the bottom plate 41A, the bottom shield pattern 46B formed on the bottom plate 41A has a non-loop shape.

The submodule 40B may include an electronic component 30 other than the inductor. In addition, the electronic component 30D and the electronic component 30 other than the inductor may be mounted on the side plate 41B.

Fifth Embodiment

Figure 20A:
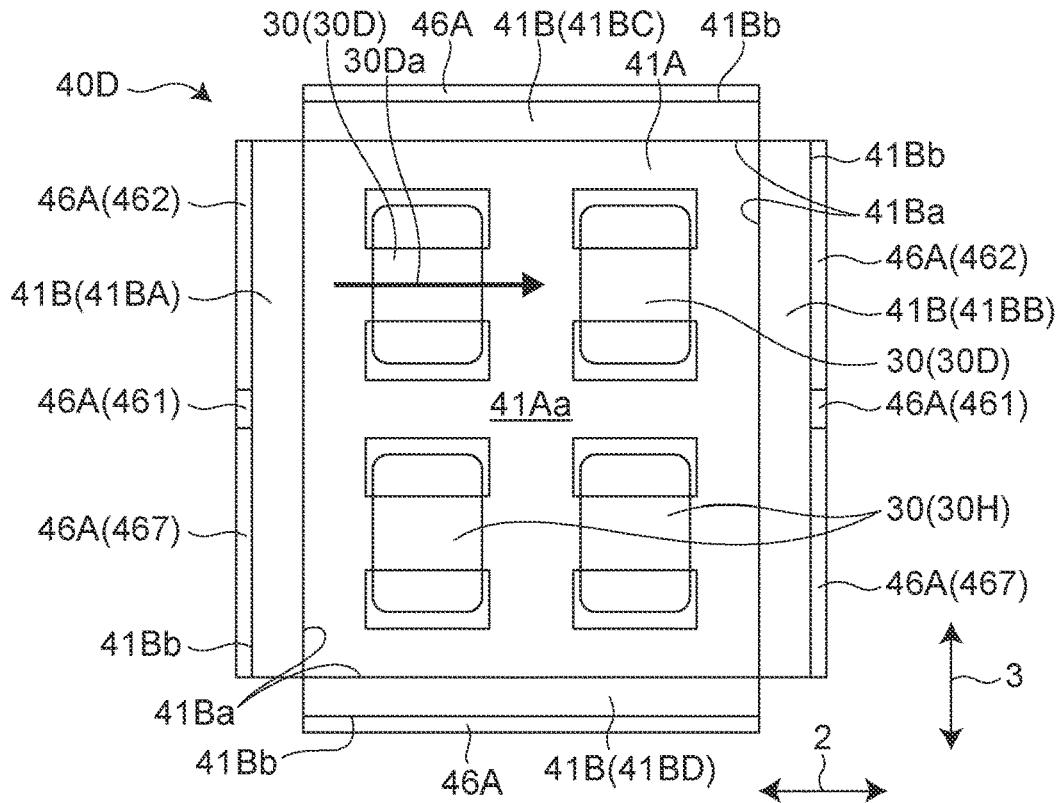
FIG. 20A is a plan view of a submodule included in a circuit module according to a fifth embodiment of the present disclosure.
Figure 20B:
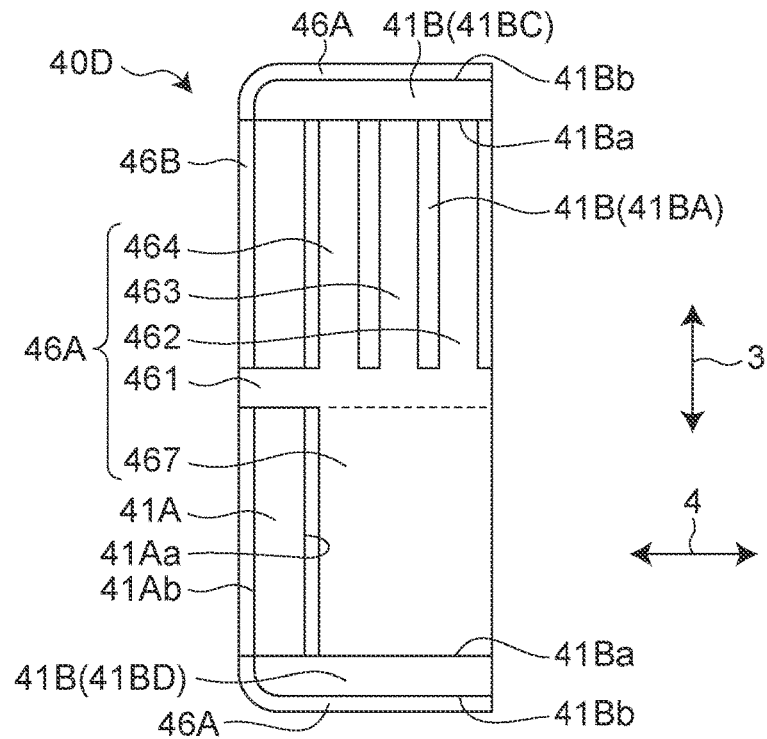
FIG. 20B is a left side view of the submodule included in the circuit module according to the fifth embodiment of the present disclosure.

FIG. 20A is a plan view of a submodule included in a circuit module according to a fifth embodiment of the present disclosure. FIG. 20B is a left side view of the submodule included in the circuit module according to the fifth embodiment of the present disclosure. The circuit module according to the fifth embodiment is different from the circuit module according to the fourth embodiment in that a submodule 40D is provided instead of the submodule 40B.

As shown in FIG. 20A, the submodule 40D includes a sub board 41, two electronic components 30D, and two electronic components 30H. In the fourth embodiment, the electronic components 30D and 30H are examples of the second electronic component.

The electronic component 30D is an inductor. In the fifth embodiment, as in the fourth embodiment, the winding axis 30Da of the electronic component 30D extends in the longitudinal direction 2. The electronic component 30H is a component other than an inductor such as a resistor.

As in the fourth embodiment, the sub board 41 includes a bottom plate 41A and side plates 41B (four side plates 41BA to 41BD). The side plates 41BA and 41BB are orthogonal to the winding axis 30Da of the electronic component 30D. The bottom plate 41A and the side plates 41BC and 41BD are parallel to the winding axis 30Da of the electronic component 30D.

As shown in FIG. 20B, the side shield pattern 46A formed on the outer side surface 41Bb of the side plate 41BA includes four linear conductor portions 461, 462, 463, and 464 and a conductor portion 467. It should be noted that although not shown, in the fifth embodiment, the side shield pattern 46A formed on the side plate 41BB has the same configuration as the side shield pattern 46A formed on the side plate 41BA.

The linear conductor portion 461 extends in the height direction 4. As shown in FIG. 20A, the linear conductor portion 461 is positioned between the electronic component 30D and the electronic component 30H in the lateral direction 3. As shown in FIG. 20B, the linear conductor portions 462, 463, and 464 extend in the lateral direction 3. The linear conductor portions 462, 463, and 464 are formed side by side in a stripe shape. One end portions of the linear conductor portions 462, 463, and 464 are connected to the linear conductor portion 461. The other end portions of the linear conductor portions 462, 463, and 464 are open. With the above configuration, the linear conductor portions 461, 462, 463, and 464 have non-loop shapes. The linear conductor portions 461, 462, 463, and 464 are examples of a non-loop portion. The linear conductor portions 462, 463, and 464 are positioned on the electronic component 30D side with respect to the linear conductor portion 461 in the lateral direction 3. The non-loop portion is formed in a region facing the electronic component 30D being an inductor in the longitudinal direction 2.

The conductor portion 467 is formed in substantially the entire region on the electronic component 30H side with respect to the linear conductor portion 461 in the lateral direction 3. The conductor portion 467 is formed in a region not facing the electronic component 30D being an inductor in the longitudinal direction 2. It should be noted that the conductor portion 467 may have a loop shape.

According to the fifth embodiment, the non-loop portion (linear conductor portions 461, 462, 463, and 464) is formed in a region facing the inductor in the side plate 41B that intersects with the winding axis 30Da of the inductor in the bottom plate 41A and the side plate 41B. Accordingly, deterioration of the characteristics of the inductor can be reduced as in the fourth embodiment. On the other hand, the conductor portion 467 formed in a region not facing the inductor in the side plate 41B, that is, a region where the inductor in the side plate 41B less likely to be affected by the magnetic field can be formed in a loop shape or a solid pattern. Accordingly, it is possible to enhance the shielding effect against the electromagnetic wave in the region not facing the inductor in the plate intersecting the winding axis 30Da of the inductor.

Sixth Embodiment

Figure 21A:
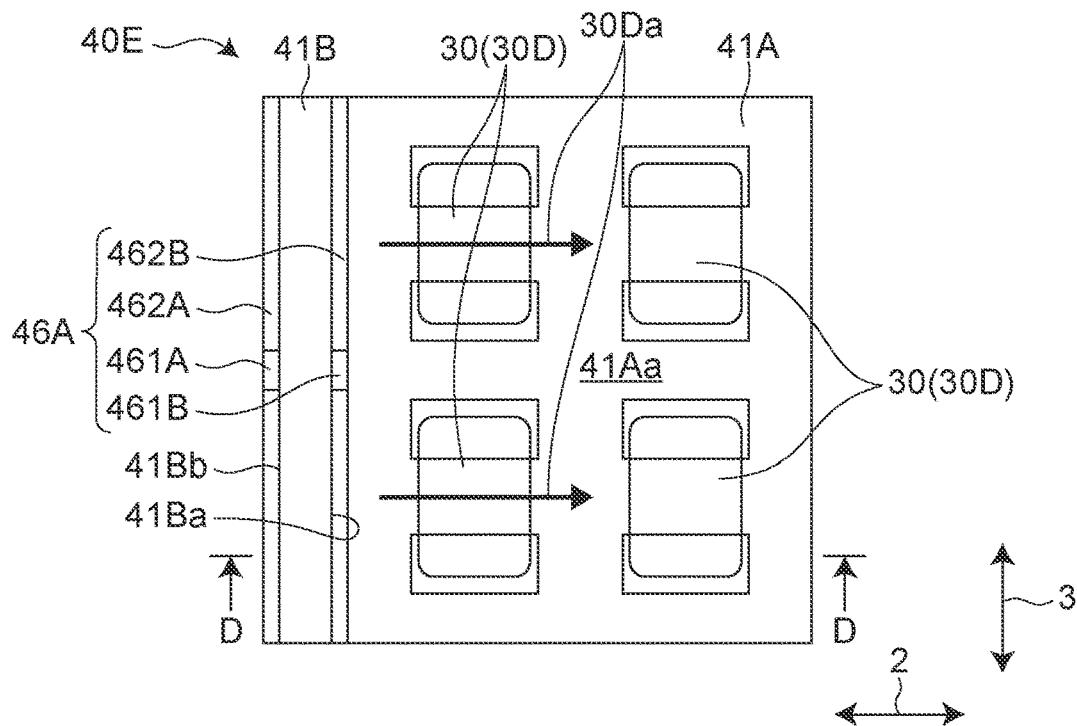
FIG. 21A is a plan view of a submodule included in a circuit module according to a sixth embodiment of the present disclosure.
Figure 21B:
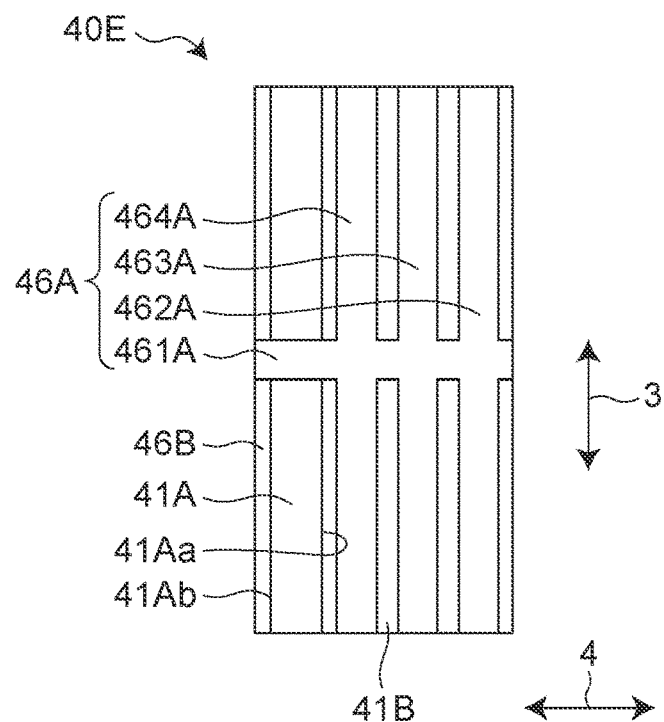
FIG. 21B is a left side view of the submodule included in the circuit module according to the sixth embodiment of the present disclosure.
Figure 21C:
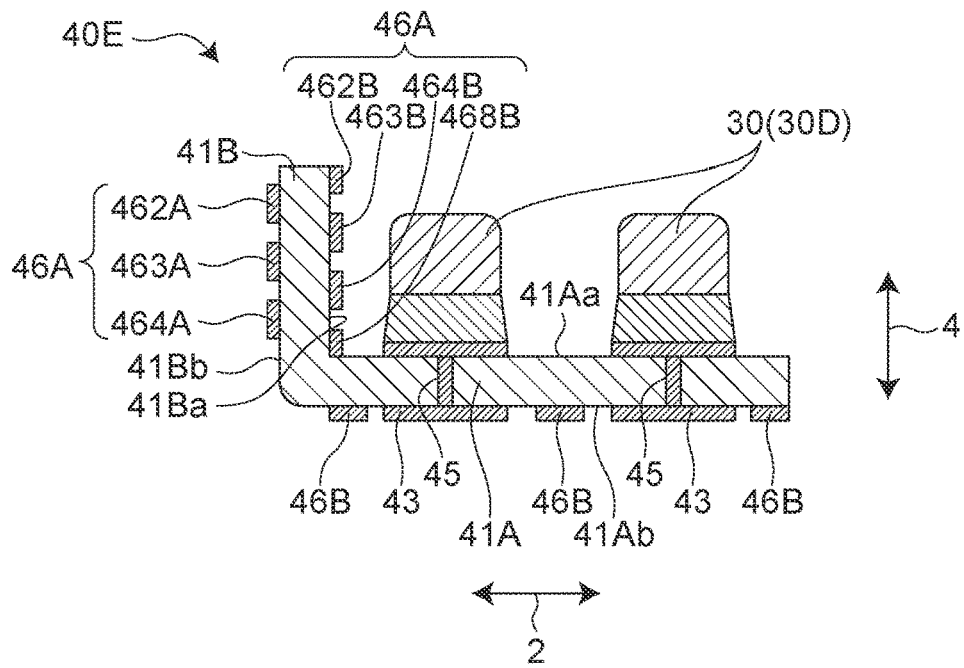
FIG. 21C is a cross-sectional view taken along line D-D in FIG. 21A.
Figure 21D:
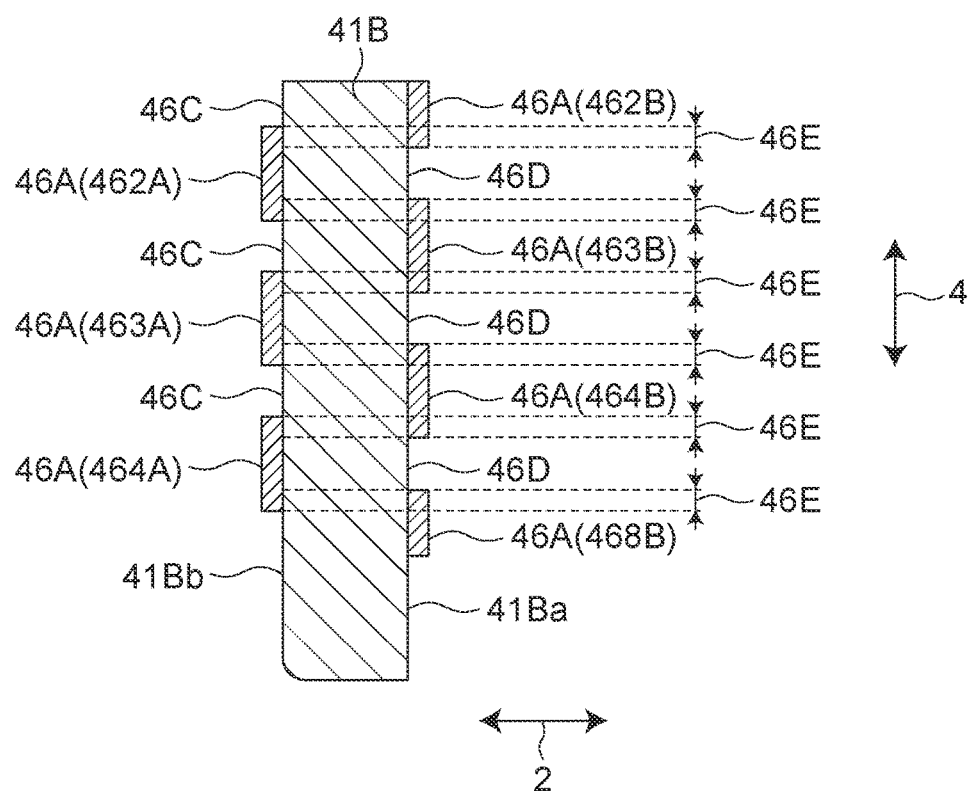
FIG. 21D is an enlarged view of the side plate in FIG. 21C.

FIG. 21A is a plan view of a submodule included in a circuit module according to a sixth embodiment of the present disclosure. FIG. 21B is a left side view of the submodule included in the circuit module according to the sixth embodiment of the present disclosure. FIG. 21C is a cross-sectional view taken along line D-D in FIG. 21A. FIG. 21D is an enlarged view of the side plate in FIG. 21C. The circuit module according to the sixth embodiment is different from the circuit module according to the fourth embodiment in that a submodule 40E is provided instead of the submodule 40B.

As shown in FIGS. 21A to 21C, the submodule 40E includes a sub board 41 and four electronic components 30D. In the sixth embodiment, the electronic component 30D is an example of the second electronic component.

As shown in FIG. 21C, the sub board 41 includes a bottom plate 41A and one side plate 41B. The side shield pattern 46A is formed on both the inner side surface 41Ba and the outer side surface 41Bb of the side plate 41B. In the sixth embodiment, the inner side surface 41Ba and the outer side surface 41Bb are examples of a layer surface. The side shield pattern 46A formed on each of the outer side surface 41Bb and the inner side surface 41Ba has a linear conductor portion as in the fourth embodiment. Specifically, as shown in FIGS. 21A to 21C, the side shield pattern 46A formed on the outer side surface 41Bb includes linear conductor portions 461A, 462A, 463A, and 464A. As shown in FIGS. 21A and 21C, the side shield pattern 46A formed on the inner side surface 41Ba includes linear conductor portions 461B, 462B, 463B, 464B, and 468B.

As shown in FIG. 21B, the configurations of the linear conductor portions 461A, 462A, 463A, and 464A are the same as those of the linear conductor portion 461, 462, 463, and 464 (see FIG. 18B) in the fourth embodiment. The linear conductor portions 461A, 462A, 463A, and 464A respectively correspond to the linear conductor portions 461, 462, 463, and 464. That is, the linear conductor portions 461A, 462A, 463A, and 464A have a non-loop shape and are examples of a non-loop portion.

Although not shown, the configurations of the linear conductor portions 461B, 462B, 463B, and 464B are substantially the same as the configurations of the linear conductor portions 461A, 462A, 463A, and 464A (see FIG. 18B). The linear conductor portions 461B, 462B, 463B, and 464B respectively correspond to the linear conductor portions 461A, 462A, 463A, and 464A. However, as shown in FIG. 21C, the linear conductor portions 461B, 462B, 463B, and 464B are respectively at positions shifted upward with respect to the linear conductor portions 461A, 462A, 463A, and 464A.

The linear conductor portion 468B extends in the lateral direction 3 (depth direction on the paper surface in FIG. 21C). The linear conductor portion 468B is positioned below the linear conductor portion 464B and is at a position shifted downward with respect to the linear conductor portion 464A. The linear conductor portion 468B is formed at an interval from the linear conductor portion 464B. That is, the linear conductor portions 462B, 463B, 464B, and 468B are formed side by side in a stripe shape. As with the linear conductor portions 462B, 463B, and 464B, the linear conductor portion 468B is connected to the linear conductor portion 461B (see FIG. 21A). That is, the linear conductor portions 461B, 462B, 463B, 464B, and 468B have a non-loop shape and are examples of a non-loop portion.

As shown in FIG. 21D, on the outer side surface 41Bb, there is a non-formed portion 46C where the side shield pattern 46A is not formed. On the inner side surface 41Ba, there is a non-formed portion 46D where the side shield pattern 46A is not formed.

The non-formed portion 46C on the outer side surface 41Bb overlaps the formed portion where the side shield pattern 46A is formed on the inner side surface 41Ba when viewed in the longitudinal direction 2 (direction orthogonal to the outer side surface 41Bb). In this case, the outer side surface 41Bb corresponds to one layer surface, and the inner side surface 41Ba corresponds to a layer surface other than the one layer surface.

The non-formed portion 46D on the inner side surface 41Ba overlaps the formed portion where the side shield pattern 46A is formed on the outer side surface 41Bb when viewed in the longitudinal direction 2. In this case, the inner side surface 41Ba corresponds to one layer surface, and the outer side surface 41Bb corresponds to a layer surface other than the one layer surface.

In addition, when viewed in the longitudinal direction 2, the linear conductor portions 462A, 463A, and 464A and the linear conductor portions 462B, 463B, 464B, and 468B overlap in the range 46E.

More specifically, when viewed in the longitudinal direction 2, the upper end portion of the linear conductor portion 462A overlaps the lower end portion of the linear conductor portion 462B, and the lower end portion of the linear conductor portion 462A overlaps the upper end portion of the linear conductor portion 463B. In addition, when viewed in the longitudinal direction 2, the upper end portion of the linear conductor portion 463A overlaps the lower end portion of the linear conductor portion 463B, and the lower end portion of the linear conductor portion 463A overlaps the upper end portion of the linear conductor portion 464B. In addition, when viewed in the longitudinal direction 2, the upper end portion of the linear conductor portion 464A overlaps the lower end portion of the linear conductor portion 464B, and the lower end portion of the linear conductor portion 464A overlaps the upper end portion of the linear conductor portion 468B.

In other words, when viewed in the longitudinal direction 2, the outer edge portion of the formed portion where the side shield pattern 46A on the inner side surface 41Ba is formed overlaps the side shield pattern 46A positioned in the peripheral portion of the non-formed portion 46C on the outer side surface 41Bb. Still in other words, when viewed in the longitudinal direction 2, the outer edge portion of the formed portion where the side shield pattern 46A on the outer side surface 41Bb is formed overlaps the side shield pattern 46A positioned in the peripheral portion of the non-formed portion 46D on the inner side surface 41Ba.

It should be noted that when viewed in the longitudinal direction 2, the linear conductor portions 462A, 463A, and 464A and the linear conductor portions 462B, 463B, 464B, and 468B do not need to overlap.

According to the sixth embodiment, the electromagnetic wave passing through the non-formed portion 46C of the outer side surface 41Bb can be shielded by the side shield pattern 46A formed in the formed portion of the inner side surface 41Ba.

According to the sixth embodiment, when viewed in the longitudinal direction 2, the side shield pattern 46A on the outer side surface 41Bb and the side shield pattern 46A on the inner side surface 41Ba partially overlap. Therefore, it is possible to prevent the electromagnetic wave from passing through the gap between the side shield pattern 46A of the outer side surface 41Bb and the side shield pattern 46A of the inner side surface 41Ba.

In the sixth embodiment, the sub board 41 is a two-layer board, and the side shield pattern 46A is formed on both the inner side surface 41Ba and the outer side surface 41Bb of the side plate 41B. However, the number of layers of the sub board 41 may be three or more. When the sub board 41 is a three-layer board, the side plate 41B has an inner layer surface (not shown) in addition to the inner side surface 41Ba and the outer side surface 41Bb. In this case, the side shield pattern 46A is formed on at least two surfaces of the inner side surface 41Ba, the outer side surface 41Bb, and the inner layer surface.

For example, when the side shield pattern 46A is formed on the outer side surface 41Bb and the inner layer surface, the non-formed portion 46C on the outer side surface 41Bb overlaps the formed portion where the side shield pattern 46A is formed on the inner layer surface when viewed in the longitudinal direction 2.

In addition, for example, when the side shield pattern 46A is formed on the inner side surface 41Ba, the outer side surface 41Bb, and the inner layer surface, for example, the following overlap may be established. That is, when viewed in the longitudinal direction 2, a part of the non-formed portion 46C on the outer side surface 41Bb may overlap the side shield pattern 46A on the inner side surface 41Ba, and a portion other than the part of the non-formed portion 46C on the outer side surface 41Bb may overlap the side shield pattern 46A on the inner layer surface.

In short, when any position of the side plate 41B is viewed along the longitudinal direction 2 from the outside of the submodule 40E, the side shield pattern 46A only needs to be formed on each layer surface so that the sight line along the longitudinal direction 2 passes through any one of the side shield patterns 46A.

Seventh Embodiment

Figure 22:
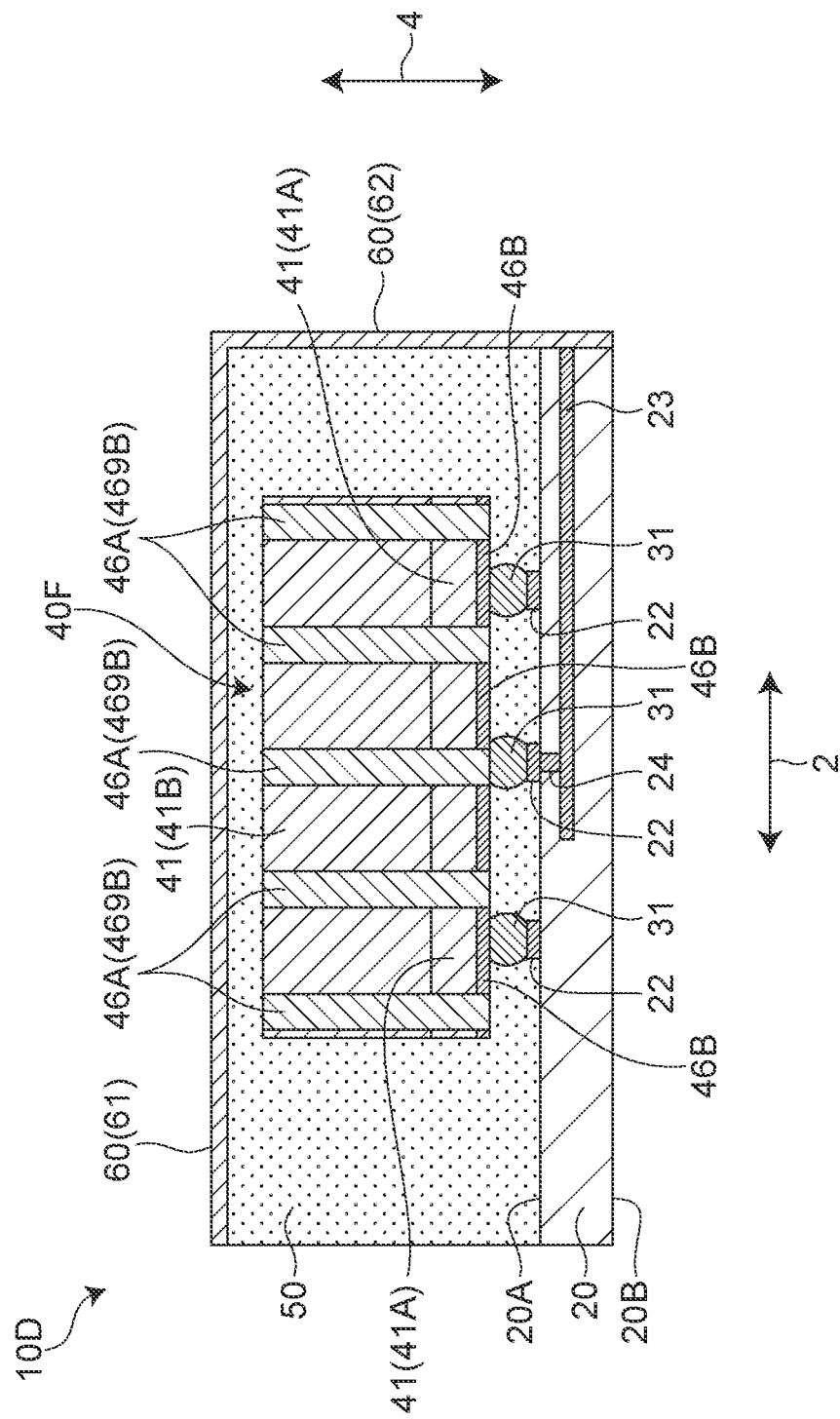
FIG. 22 is a longitudinal sectional view of a circuit module according to a seventh embodiment of the present disclosure.

FIG. 22 is a longitudinal sectional view of a circuit module according to a seventh embodiment of the present disclosure. The circuit module 10D according to the seventh embodiment is different from the circuit module according to the fourth embodiment in that a submodule 40F is provided instead of the submodule 40B.

As shown in FIG. 22, the side shield pattern 46A of the submodule 40F includes a plurality of linear conductor portions 469B. The plurality of linear conductor portions 469B extend in the height direction 4. The plurality of linear conductor portions 469B are formed at intervals from each other in the longitudinal direction 2. That is, the plurality of linear conductor portions 469B are formed side by side in a stripe shape. The lower end portion of each linear conductor portion 469B is connected to a bottom shield pattern 46B formed on the bottom plate 41A. The upper end portion of each linear conductor portion 469B extends to the upper end of the side plate 41B. The plurality of linear conductor portions 469B configured as described above have a non-loop shape and are examples of a non-loop portion.

The upper end portion of the side plate 41B of the submodule 40F is away from the upper film 61 of the shield film 60. That is, the side shield pattern 46A is away from the upper film 61 of the shield film 60.

It should be noted that the upper end portion of each linear conductor portion 469B may extend only to a lower part from the upper end of the side plate 41B. In this case, the upper end portion of the side plate 41B of the submodule 40F may be connected to the upper film 61 of the shield film 60. This is because, in this case, even when the upper end portion of the side plate 41B of the submodule 40F is connected to the upper film 61 of the shield film 60, each linear conductor portion 469B is away from the upper film 61 of the shield film 60.

According to the seventh embodiment, the non-loop portion (the plurality of linear conductor portions 469B) is away from the upper film 61 of the shield film 60. Therefore, by connecting the plurality of linear conductor portions 469B to the upper film 61 of the shield film 60, it is possible to prevent a loop shape from being formed by the plurality of linear conductor portions 469B, the upper film 61 of the shield film 60, and the bottom shield pattern 46B.

It should be noted that appropriately combining any embodiment among the various embodiments allows the effect of each embodiment to be produced.

The present disclosure has been sufficiently described in connection with the preferable embodiment with reference to the drawings as appropriate, but various modifications and corrections are apparent for those skilled in the art. It should be understood that as long as such modifications and corrections do not depart from the scope of the present disclosure by the attached claims, they are included therein.

10 circuit module
20 main board
30 electronic component
30A electronic component (first electronic component)
30B electronic component (first electronic component)
30C electronic component (first electronic component)
30D electronic component (second electronic component)
30Da winding axis
30E electronic component (second electronic component)
40 submodule
41 sub board
41A bottom plate
41Aa upper surface (first surface)
41Ab lower surface (third surface)
41Ac inner layer surface
41B side plate
41Ba inner side surface (second surface, layer surface)
41Bb outer side surface (one layer surface)
41Bc inner layer surface
46 shield pattern (shield member)
461 linear conductor portion (non-loop portion)
462 linear conductor portion (non-loop portion)
463 linear conductor portion (non-loop portion)
464 linear conductor portion (non-loop portion)
46A side shield pattern (side shield member)
46B bottom shield pattern (bottom shield member)
46C non-formed portion
46D non-formed portion
50 sealing resin
60 shield film

What is claimed is:

1. A circuit module comprising:
a main board;
at least one first electronic component mounted on the main board; and
a submodule mounted on the main board, wherein the submodule comprises:
a sub board mounted on the main board;
at least one second electronic component mounted on the sub board; and
a conductive shield member formed on the sub board, wherein
the sub board comprises:
a bottom plate mounted on the main board so as to face the main board; and
a side plate extending from the bottom plate so as to be away from the main board, wherein
the second electronic component is mounted on at least one of a first surface on the opposite side from the main board in the bottom plate and a second surface continuous with the first surface among surfaces of the side plate, and wherein
the shield member comprises:
a bottom shield member formed on the bottom plate; and
a side shield member formed on the side plate.

2. The circuit module of claim 1, wherein
the bottom plate and the side plate are bended portions of the sub board.

3. The circuit module of claim 1, wherein
the side plate is positioned between the first electronic component and the second electronic component.

4. The circuit module of claim 1, wherein
the bottom shield member and the side shield member are connected to each other.

5. The circuit module of claim 1, wherein
the bottom shield member is formed on a third surface on the main board side in the bottom plate.

6. The circuit module of claim 1, wherein
at least one of the bottom plate and the side plate has an inner layer surface, and wherein
the shield member is formed on the inner layer surface.

7. The circuit module of claim 1, wherein
in a plan view, the second surface of the side plate extends outward from the first surface along a side of the first surface of the bottom plate.

8. The circuit module of claim 1, wherein
the first electronic component comprises an interfered-system component to be affected by electromagnetic waves, and wherein
the second electronic component comprises an interfering-system component generating electromagnetic waves and does not comprise the interfered-system component to be affected by electromagnetic waves.

9. The circuit module of claim 1, wherein
the first electronic component comprises an interfering-system component generating electromagnetic waves, and wherein
the second electronic component comprises an interfered-system component to be affected by electromagnetic waves and does not comprise an interfering-system component generating electromagnetic waves.

10. The circuit module of claim 9, wherein
the interfered-system component comprises an inductor, and wherein
the shield member comprises a non-loop shaped non-loop portion on a plate intersecting with a winding axis of the inductor among the bottom plate and the side plate.

11. The circuit module of claim 10, wherein
the non-loop portion is formed in a region facing the inductor on a plate intersecting with the winding axis of the inductor among the bottom plate and the side plate.

12. The circuit module of claim 10, wherein
the non-loop portion comprises a plurality of linear conductor portions formed side by side in a stripe shape.

13. The circuit module of claim 10, wherein
at least one of the bottom plate and the side plate has a plurality of layer surfaces, and the non-loop portion is formed on each of the plurality of layer surfaces, and wherein
a non-formed portion in which the shield member is not formed on one layer surface among the plurality of layer surfaces overlaps at least one formed portion in which the shield member is formed on at least one layer surface other than the one layer surface among the plurality of layer surfaces when viewed in a direction orthogonal to the one layer surface.

14. The circuit module of claim 13, wherein
when viewed in a direction orthogonal to the one layer surface, an outer edge portion of the formed portion on the least one layer surface other than the one layer surface overlaps the shield member positioned in a peripheral portion of the non-formed portion on the one layer surface.

15. The circuit module of claim 10, further comprising:
a sealing resin provided on the main board and covering the first electronic component and the submodule; and
a conductive shield film covering at least a part of the sealing resin, and wherein
the non-loop portion is away from the shield film.

16. The circuit module of claim 1, further comprising:
a sealing resin provided on the main board and covering the first electronic component and the submodule; and
a conductive shield film covering an upper part of the sealing resin, wherein
the upper end portion of the side plate is in contact with the shield film, and wherein
the side shield member is connected to the shield film.

17. The circuit module of claim 16, wherein
an extending tip surface of the side plate along a thickness direction of the side plate and an extending tip surface of the side shield member along a thickness direction of the side shield member are in contact with the shield film.

18. The circuit module of claim 2, wherein
the side plate is positioned between the first electronic component and the second electronic component.

19. The circuit module of claim 2, wherein
the bottom shield member and the side shield member are connected to each other.

20. The circuit module of claim 3, wherein
the bottom shield member and the side shield member are connected to each other.

* * * * *